US012796248B2

(12) United States Patent
Yeo et al.

(10) Patent No.: US 12,796,248 B2
(45) Date of Patent: Nov. 10, 2026

(54) DISPLAY DEVICE

(71) Applicant: Samsung Display Co., Ltd., Yongin-si (KR)

(72) Inventors: Inhyuck Yeo, Yongin-si (KR); Kiho Bang, Yongin-si (KR); Eunhye Kim, Yongin-si (KR); Eunae Jung, Yongin-si (KR); Wonsuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 430 days.

(21) Appl. No.: 18/477,311

(22) Filed: Sep. 28, 2023

(65) Prior Publication Data

US 2024/0172505 A1 May 23, 2024

(30) Foreign Application Priority Data

Nov. 17, 2022 (KR) ........................ 10-2022-0154671

(51) Int. Cl.
*H10K 59/131* (2023.01)
*H10K 59/124* (2023.01)

(52) U.S. Cl.
CPC ......... *H10K 59/131* (2023.02); *H10K 59/124* (2023.02)

(58) Field of Classification Search
CPC ............... H10K 59/131; H10K 59/124; H10K 2102/311; H10K 2102/351; H10K 59/12; H10D 86/443; H10D 86/60; H10L 77/111
See application file for complete search history.

(56) References Cited

U.S. PATENT DOCUMENTS 11,175,697 B2 11/2021 Jeong et al.
11,217,638 B2 1/2022 Bang et al.
12,144,211 B2 11/2024 You
2018/0033980 A1* 2/2018 Park .................... H10K 10/476

FOREIGN PATENT DOCUMENTS

KR 10-2019-0035995 A 4/2019
KR 10-2021-0111926 A 9/2021
KR 10-2303210 B1 9/2021
KR 10-2022-0010692 A 1/2022

* cited by examiner

*Primary Examiner* — Calvin Y Choi
(74) *Attorney, Agent, or Firm* — Womble Bond Dickinson (US) LLP

(57) ABSTRACT

A display device includes a base layer including a first area including a display area and a non-display area and a second area, lower inorganic layers disposed on the base layer, a pixel, a signal line electrically connected to the pixel and including a first line portion overlapping the non-display area and a second line portion disposed on the first line portion, overlapping the non-display area and the second area, and connected to the first line portion in the non-display area, an organic pattern disposed on an area where the first line portion is connected to the second line portion in the non-display area, an upper inorganic layer covering the organic pattern, a conductive pattern covering the organic pattern, and a power line disposed closer to the display area than the second line portion is and extending in a direction crossing the first line portion.

20 Claims, 17 Drawing Sheets

DISPLAY DEVICE

CROSS-REFERENCE TO RELATED APPLICATION

The present application claims priority to and the benefit of Korean Patent Application No. 10-2022-0154671, filed on Nov. 17, 2022, the entire content of which is incorporated herein by reference.

BACKGROUND

1. Field

Aspects of some embodiments of the present disclosure relate to a display device.

2. Description of the Related Art

Electronic devices, such as smartphones, tablet computers, notebook computers, car navigation devices, smart televisions, are being developed. The electronic devices may include a display device to provide or display graphical information to users.

Various types of display devices are being developed to satisfy a user's UX/UI. Among the various types of display devices, the development of a flexible display device is booming. In addition, a display device with a slim bezel is being developed.

The above information disclosed in this Background section is only for enhancement of understanding of the background and therefore the information discussed in this Background section does not necessarily constitute prior art.

SUMMARY

Aspects of some embodiments of the present disclosure relate to a display device. For example, aspects of some embodiments of the present disclosure relate to a display device including a plurality of conductive patterns.

Aspects of some embodiments of the present disclosure include a display device in which a risk of short-circuit between signal lines and power lines may be relatively reduced.

According to some embodiments of the present disclosure, a display device includes a base layer including a first area including a display area and a non-display area and a second area adjacent to the first area and bent at a predetermined curvature, a plurality of lower inorganic layers disposed on the base layer, a pixel disposed in the display area, a signal line electrically connected to the pixel and including a first line portion overlapping the non-display area and a second line portion disposed on the first line portion, overlapping the non-display area and the second area, and connected to the first line portion in the non-display area, an organic pattern disposed on a lower inorganic layer disposed on an uppermost position among the lower inorganic layers and at an area where the first line portion is connected to the second line portion in the non-display area, an upper inorganic layer covering the organic pattern in a plan view, a conductive pattern disposed on the upper inorganic layer and covering the organic pattern in the plan view, and a power line disposed closer to the display area than the second line portion is and extending in a direction crossing the first line portion. According to some embodiments, the conductive pattern is spaced apart from the power line by a distance of at least 4 micrometers (or about 4 micrometers) in the plan view.

According to some embodiments, the conductive pattern is spaced apart from the power line by a distance equal to or greater than 4 micrometers (or about 4 micrometers) and equal to or smaller than 7 micrometers (or about 7 micrometers) in the plan view.

According to some embodiments, the conductive pattern is spaced apart from the organic pattern by a distance equal to or greater than 1 micrometer (or about 1 micrometer) and equal to or smaller than 3 micrometers (or about 3 micrometers) in the plan view.

According to some embodiments, the organic pattern includes a first pattern and a second pattern disposed on the first pattern and disposed inside the first pattern in the plan view.

According to some embodiments, the display device further includes a protective conductive pattern overlapping the first area and covering a portion of the second line portion in the plan view.

According to some embodiments, a portion of the protective conductive pattern is disposed between the first pattern and the second pattern.

According to some embodiments, the protective conductive pattern extends in a direction substantially parallel to a direction in which the second line portion extends.

According to some embodiments, the second line portion is divided into a plurality of lines, the protective conductive pattern is divided into a plurality of line protective patterns, and the line protective patterns overlap the plurality of lines, respectively.

According to some embodiments, an end of the conductive pattern is disposed further away from the second area than a point where the second line portion is divided.

According to some embodiments, the lower inorganic layer disposed at the uppermost position among the lower inorganic layers includes a first portion area in which the organic pattern is disposed and a second portion area in which the organic pattern is not disposed, and the second portion area surrounds the organic pattern.

According to some embodiments, the conductive pattern overlaps the first portion area and a portion of the second portion area.

According to some embodiments, the upper inorganic layer covers the first portion area and the second portion area.

According to some embodiments, the first line portion and the second line portion are connected to each other via a contact hole defined through some of the lower inorganic layers.

According to some embodiments, the conductive pattern is provided in plural, and the conductive patterns adjacent to each other are spaced apart from each other by a distance equal to or greater than 6 micrometers (or about 6 micrometers) and equal to or smaller than 10 micrometers (or about 10 micrometers) in the plan view.

According to some embodiments, the lower inorganic layers corresponding to the second area are provided with a groove defined therein and extending in a direction in which a bending axis extends.

According to some embodiments of the present disclosure, a display device includes a base layer including a first area including a display area and a non-display area and a second area adjacent to the first area and bent at a predetermined curvature, a plurality of lower inorganic layers disposed on the base layer, first and second pixels disposed in the display area, a first signal line electrically connected to the first pixel and including a first-first line portion overlapping the non-display area and a second-first line portion disposed on the first-first line portion, overlapping the non-display area and the second area, and connected to the first-first line portion in the non-display area, a second signal line electrically connected to the second pixel and including a first-second line portion overlapping the non-display area and a second-second line portion disposed on the first-second line portion, overlapping the non-display area and the second area, and connected to the first-second line portion in the non-display area, a first organic pattern disposed on a lower inorganic layer disposed at an uppermost position among the lower inorganic layers and disposed on an area where the first-first line portion is connected to the second-first line portion in the non-display area, a second organic pattern disposed on the lower inorganic layer disposed at the uppermost position among the lower inorganic layers and disposed on an area where the first-second line portion is connected to the second-second line portion in the non-display area, an upper inorganic layer covering the first and second organic patterns in a plan view, a first conductive pattern disposed on the upper inorganic layer and covering the first organic pattern in the plan view, and a second conductive pattern disposed on the upper inorganic layer and covering the second organic pattern in the plan view. According to some embodiments, the first conductive pattern is spaced apart from the second conductive pattern by a distance equal to or greater than 6 micrometers (or about 6 micrometers) and equal to or smaller than 10 micrometers (or about 10 micrometers) in the plan view.

According to some embodiments, the first conductive pattern is spaced apart from the first organic pattern by a distance equal to or greater than 1 micrometers (or about 1 micrometer) and equal to or smaller than 3 micrometers (or about 3 micrometers) in the plan view, and the second conductive pattern is spaced apart from the second organic pattern by a distance equal to or greater than 1 micrometer (or about 1 micrometer) and equal to or smaller than 3 micrometers (or about 3 micrometers) in the plan view.

According to some embodiments, the display device further includes a first protective conductive pattern overlapping the first area and covering a portion of the second-first line portion in the plan view and a second protective conductive pattern overlapping the second area and covering a portion of the second-second line portion in the plan view.

According to some embodiments, an organic pattern is not disposed between the first organic pattern and the second organic pattern.

According to some embodiments of the present disclosure, a display device includes a base layer including a first area including a display area and a non-display area and a second area adjacent to the first area and bent at a predetermined curvature, a plurality of lower inorganic layers disposed on the base layer, a pixel disposed in the display area, a signal line electrically connected to the pixel and including a first line portion overlapping the non-display area and a second line portion disposed on the first line portion, overlapping the non-display area and the second area, and connected to the first line portion in the non-display area, an organic pattern disposed on a lower inorganic layer disposed at an uppermost position among the lower inorganic layers and disposed on an area where the first line portion is connected to the second line portion in the non-display area, an upper inorganic layer covering the organic pattern in a plan view, a power line disposed closer to the display area than the second line portion is and extending in a direction crossing the first line portion. According to some embodiments, the lower inorganic layer disposed at the uppermost position among the lower inorganic layers includes a first portion area in which the organic pattern is disposed and a second portion area in which the organic pattern is not disposed, and the second portion area surrounds the organic pattern.

According to some embodiments, the conductive patterns may be spaced apart from the power line by a distance (e.g., a set or predetermined distance) to reduce a risk of short-circuit between the power line and the conductive patterns.

According to some embodiments, the point where the second line portion is divided is not covered by the conductive pattern, and thus, a risk of short-circuit between the second line portion and the conductive pattern may be relatively reduced.

BRIEF DESCRIPTION OF THE DRAWINGS

The above and other characteristics of embodiments according to the present disclosure will become more readily apparent by reference to the following detailed description when considered in conjunction with the accompanying drawings wherein.

DETAILED DESCRIPTION

Figure 1A:
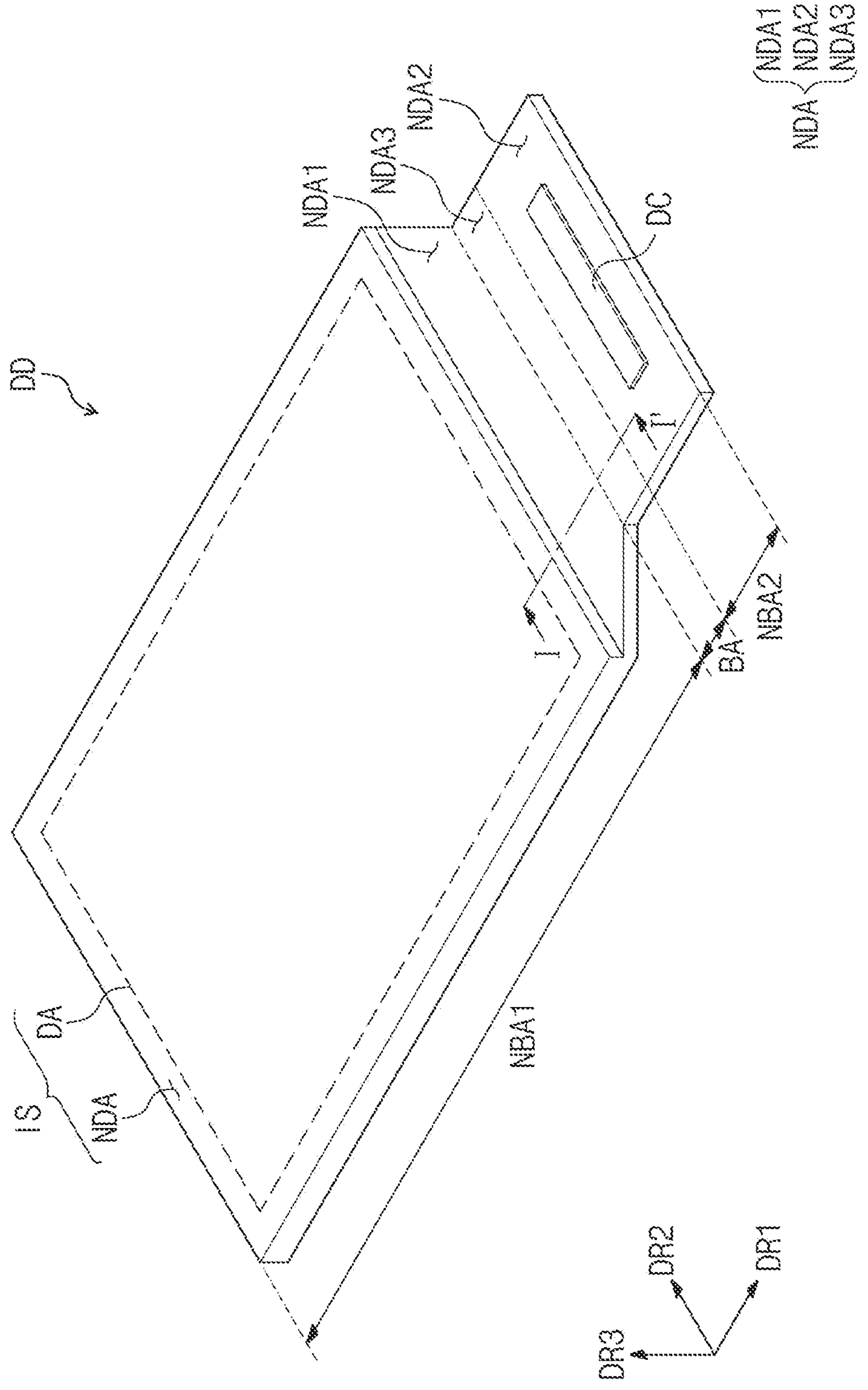
FIGS. 1A and 1B are perspective views of a display device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value."

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described with reference to accompanying drawings.

Figure 1B:
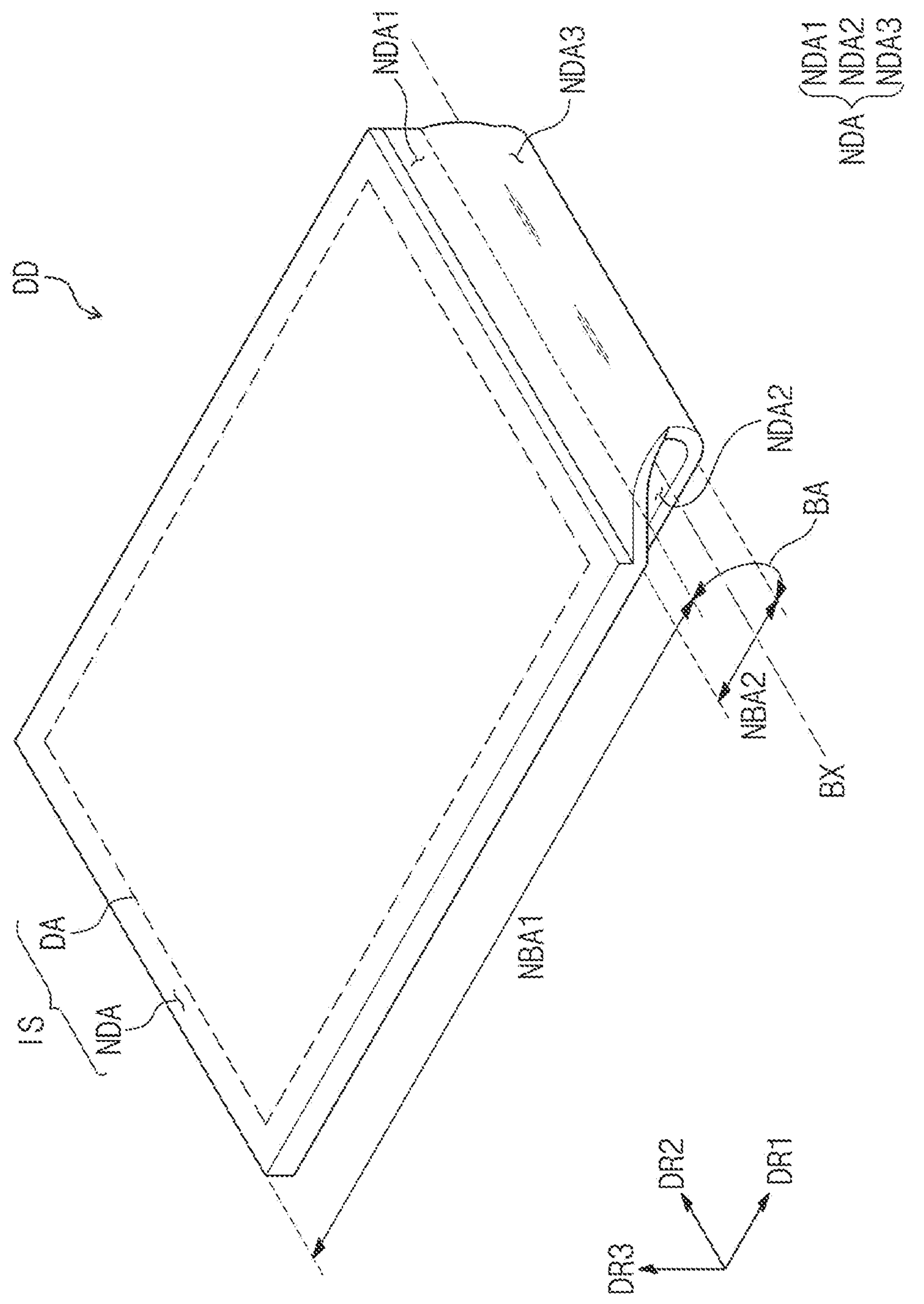
Figure 2:
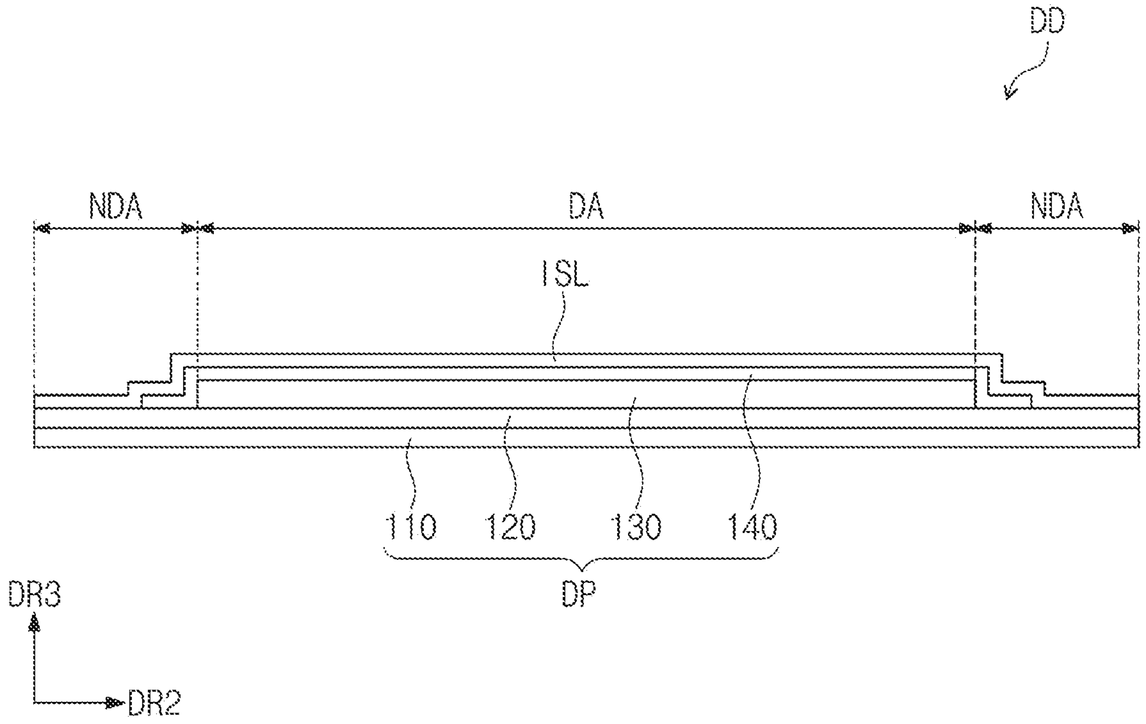
FIG. 2 is a cross-sectional view of a display device according to some embodiments of the present disclosure.

FIGS. 1A and 1B are perspective views of a display device DD according to some embodiments of the present disclosure. FIG. 2 is a cross-sectional view of the display device DD according to some embodiments of the present disclosure.

Referring to FIGS. 1A and 1B, a display surface IS through which images are displayed may be substantially parallel to a plane defined by a first directional axis DR1 and a second directional axis DR2. A third directional axis DR3 may indicate a normal line direction relative to the display surface IS, i.e., a thickness direction of the display device DD. Front (or upper) and rear (or lower) surfaces of each member may be distinguished from each other with respect to the third directional axis DR3. Hereinafter, first, second, and third directions may correspond to directions respectively indicated by the first, second, and third directional axes DR1, DR2, and DR3 and may be assigned with the same reference numerals as the first, second, and third directional axes DR1, DR2, and DR3.

As shown in FIGS. 1A and 1B, the display device DD may include a display area DA at which images are displayed and a non-display area NDA defined adjacent to (e.g., in a periphery area or outside a footprint of) the display area DA. The images may not be displayed at the non-display area NDA. The non-display area NDA may surround the display area DA.

According to some embodiments, a portion of the display device DD may be bent with a curvature (e.g., a set or predetermined curvature). The display device DD may include a first non-bending area NBA1 (hereinafter, referred to as a first area), a second non-bending area NBA2 (hereinafter, referred to as a third area) spaced apart from the first non-bending area NBA1 in the first direction DR1, and a bending area BA (hereinafter, referred to as a second area) defined between the first non-bending area NBA1 and the second non-bending area NBA2. The first area NBA1 may include the display area DA and a portion (hereinafter, referred to as a first non-display area NDA1) of the non-display area NDA. The third area NBA2 may include another portion (hereinafter, referred to as a second non-display area NDA2) of the non-display area NDA, and the third area NBA2 may include an area (hereinafter, referred to as a third non-display area NDA3) between the first non-display area NDA1 and the second non-display area NDA2.

The second area BA may be bent along a bending axis BX defined parallel to the second direction DR2. The second area BA and the third area NBA2 may have a width smaller than a width of the first area NBA1 in the second direction DR2. A driving chip DC may be mounted in the third area NBA2, however, it should not be limited thereto or thereby. According to some embodiments, the driving chip DC may be mounted on a circuit board, and the circuit board may be electrically connected to the third area NBA2.

As the second area BA is bent, the third area NBA2 may be disposed to face the first area NBA1, and thus, a size of the non-display area NDA in the display surface IS may be reduced. Referring to the display device DD of FIG. 1B, the size of the non-display area NDA may be reduced by at least the third area NBA2 when compared with the display device DD shown in FIG. 1A. As described above, as the second area BA is bent, a bezel area of the display device DD may be reduced.

The first area NBA1, the second area BA, and the third area NBA2 may be equally applied to a display panel DP and an input sensor ISL of the display device DD. The display area DA and the non-display area NDA may also be equally applied to the display panel DP. The input sensor ISL may include a sensing area corresponding to the display area DA and a non-sensing area corresponding to the non-display area NDA.

According to some embodiments, the display area DA may have a quadrangular shape, however, the shape of the display area DA is not limited to the quadrangular shape, and the display area DA may have various shapes according to various embodiments. The shape of the display area DA and the shape of the non-display area NDA may be changed. For instance, the non-display area NDA may be disposed to be adjacent to only a portion of the display area DA. According to some embodiments, the display device DD applied to a mobile phone is shown as a representative example, however, it should not be particularly limited. According to some embodiments, the display device DD may be applied to a large-sized electronic item, such as a television set and a monitor, and a small- and medium-sized electronic item, such as a tablet computer, a car navigation unit, a game unit, and a smart watch.

FIG. 2 is a cross-sectional view of the display device DD according to some embodiments of the present disclosure. FIG. 2 shows a cross-section defined by the second directional axis DR2 and the third directional axis DR3 in the first area NBA1.

Referring to FIG. 2, the display device DD may include the display panel DP and the input sensor ISL. According to some embodiments, the display device DD may further include a protective member disposed on a lower surface of the display panel DP and an anti-reflective member and/or a window member disposed on an upper surface of the input sensor ISL.

The display panel DP may be a light-emitting type display panel, however, embodiments according to the present disclosure are not limited thereto. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, or a micro-LED. Hereinafter, the organic light emitting display panel will be described as the display panel DP.

The display panel DP may include a base layer 110, a circuit element layer 120, a light emitting element layer 130, and a thin film encapsulation layer 140. The circuit element layer 120, the light emitting element layer 130, and the thin film encapsulation layer 140 may be disposed on the base layer 110. The input sensor ISL may be disposed directly on the thin film encapsulation layer 140. In the present disclosure, the expression "component A is disposed directly on component B" means that no intervening adhesive layers are present between the component A and the component B.

The base layer 110 may include at least a plastic film. The base layer 110 may be a flexible substrate and may include a plastic substrate, a glass substrate, a metal substrate, or an organic/inorganic composite material substrate. The base layer 110 may include two organic layers and an inorganic layer disposed between the two organic layers. The display area DA, the non-display area NDA, the first area NBA1, the second area BA, and the third area NBA2 described with reference to FIGS. 1A and 1B may be equally applied to the base layer 110.

The circuit element layer 120 may include at least one insulating layer and a circuit element. The insulating layer may include at least one inorganic layer and at least one organic layer. The circuit element may include signal lines and a pixel driving circuit. This will be described in detail later.

The light emitting element layer 130 may include a display element. The light emitting element layer 130 may further include an organic layer such as a pixel definition layer.

The thin film encapsulation layer 140 may include a plurality of thin layers. Some thin layers may be provided to improve an optical efficiency, and some thin layers may be provided to protect organic light emitting diodes. The thin film encapsulation layer 140 will be described in detail later.

The input sensor ISL may obtain coordinate information of an external input. The input sensor ISL may have a multi-layer structure. The input sensor ISL may include a single or multiple conductive layers. The input sensor ISL may include a single or multiple insulating layers. The input sensor ISL may sense the external input in a capacitive method. In the present disclosure, an operation method of the input sensor ISL should not be particularly limited. According to some embodiments, the input sensor ISL may sense the external input using an electromagnetic induction method or a pressure sensing method.

Figure 3:
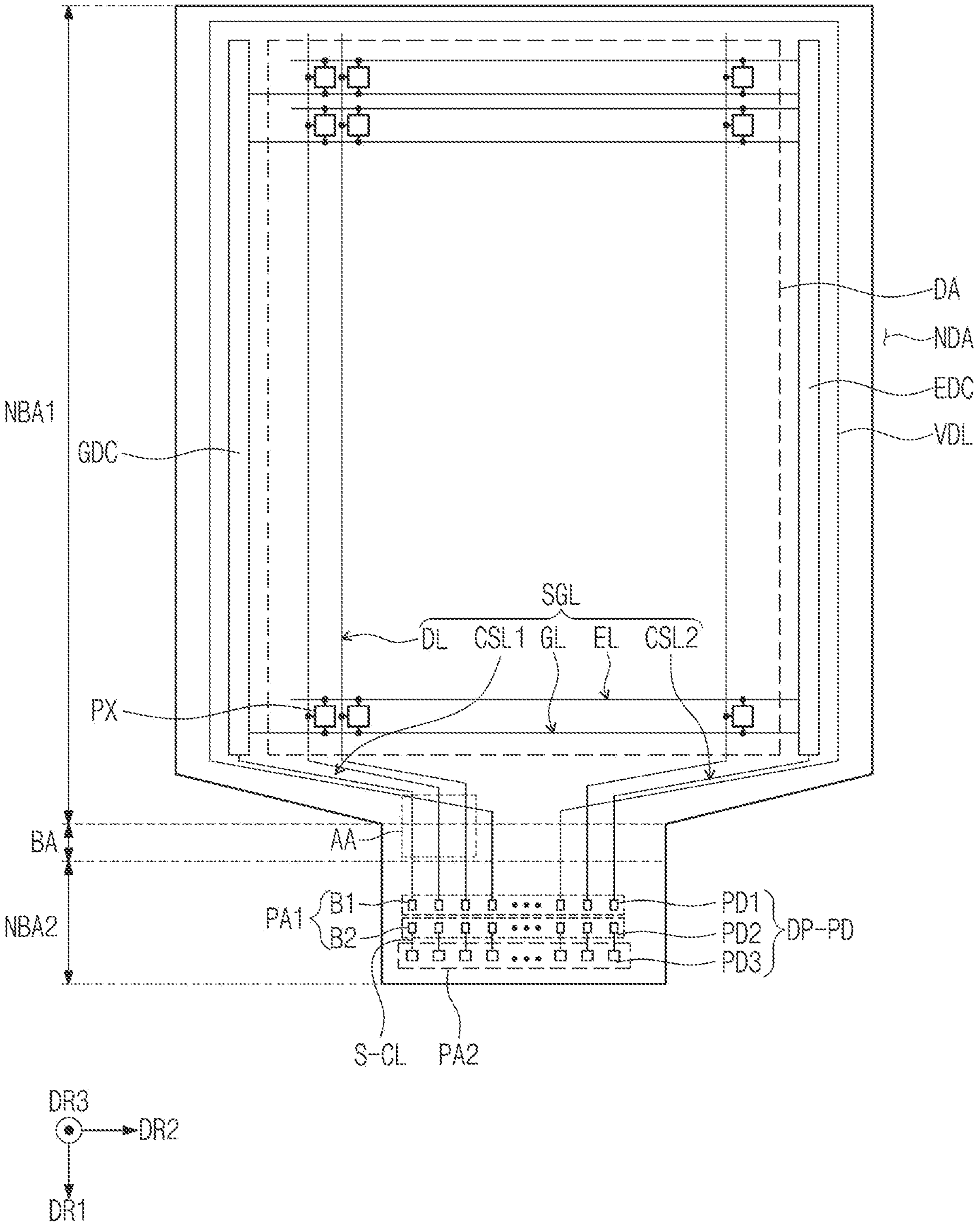
FIG. 3 is a plan view of a display panel according to some embodiments of the present disclosure.

FIG. 3 is a plan view of the display panel according to some embodiments of the present disclosure.

Referring to FIG. 3, the display panel DP may include the display area DA and the non-display area NDA when viewed in a plane (e.g., when viewed from a direction perpendicular or normal with respect to a plane parallel to a display surface of the display area, or in a plan view). The display panel DP may include the first area NBA1, the second area BA, and the third area NBA2.

The display panel DP may include driving circuits GDC and EDC, a plurality of signal lines SGL, a power line VDL, and a plurality of pixels PX. The pixels PX may be arranged in the display area DA. Each of the pixels PX may include a light emitting element and a pixel driving circuit connected to the light emitting element. The driving circuits GDC and EDC, the signal lines SGL, the power line VDL, and the pixel driving circuit may be included in the circuit element layer 120 shown in FIG. 2.

The driving circuits GDC and EDC may include a scan driving circuit GDC and a light emission driving circuit EDC, which are arranged in the non-display area NDA. The scan driving circuit GDC may generate a plurality of scan signals and may sequentially output the scan signals to a plurality of scan lines GL described later. The light emission driving circuit EDC may generate a plurality of pulse signals and may sequentially output the pulse signals to a plurality of light emission signal lines EL described later. The light emission driving circuit EDC may be a second scan driving circuit generating another type of scan signals that are activated in a period different from a period during which the scan signals generated by the scan driving circuit GDC are activated.

Each of the scan driving circuit GDC and the light emission driving circuit EDC may include a plurality of thin film transistors formed through the same process, e.g., a low temperature polycrystalline silicon (LTPS) process or a low temperature polycrystalline oxide (LTPO) process as the pixel driving circuit of the pixels PX.

The signal lines SGL may include the scan lines GL, the light emission signal lines EL, data lines DL, and signal transmission lines CSL1 and CSL2. Each of the data lines DL may be connected to corresponding pixels among the pixels PX. Each of the data lines DL may provide a data signal from the driving chip DC (refer to FIG. 1A) to the corresponding pixels among the pixels PX. The data lines DL may overlap the first area NBA1, the second area BA, and the third area NBA2.

The signal transmission lines CSL1 and CSL2 may include a first signal transmission line CSL1 that provides signals to the scan driving circuit GDC and a second signal transmission line CSL2 that provides signals to the light emission driving circuit EDC. The first signal transmission line CSL1 and the second signal transmission line CSL2 may overlap the first area NBA1, the second area BA, and the third area NBA2.

Each of the first signal transmission line CSL1 and the second signal transmission line CSL2 is shown as one signal line, however, each of the first signal transmission line CSL1 and the second signal transmission line CSL2 may be provided in plural. The first signal transmission line CSL1 and the second signal transmission line CSL2 may include a first signal line receiving a first bias voltage and a second signal line receiving a second bias voltage lower than the first bias voltage. A difference between the first bias voltage and the second bias voltage may be equal to or greater than about 10V, and in detail, may be within a range from about 20V to about 30V.

The first signal transmission line CSL1 and the second signal transmission line CSL2 may further include a third signal line transmitting a clock signal. The first signal transmission line CSL1 and the second signal transmission line CSL2 may include a plurality of third signal lines transmitting different clock signals.

Each of the scan driving circuit GDC and the light emission driving circuit EDC may receive the clock signal, the first bias voltage, and the second bias voltage and may generate a pulse signal. The scan driving circuit GDC and the light emission driving circuit EDC may receive clock signals different from each other. The first bias voltage applied to the scan driving circuit GDC may have a level different from a level of the first bias voltage applied to the light emission driving circuit EDC, and the second bias voltage applied to the scan driving circuit GDC may have a level different from a level of the second bias voltage applied to the light emission driving circuit EDC.

The power line VDL may be connected to the pixels PX and may supply a power to the pixels. The power line VDL may overlap the first area NBA1, the second area BA, and the third area NBA2. The power line VDL may be connected to electrodes of thin film transistors S-TFT and O-TFT (refer to FIG. 4) included in the pixel and may supply the power to the pixel. The power line VDL may be connected to an electrode of a light emitting element LD (refer to FIG. 4) and may supply the power to the light emitting element LD (refer to FIG. 4).

The display panel DP may include a plurality of signal pads DP-PD arranged in the third area NBA2. The signal pads DP-PD may include first pads PD1, second pads PD2, and third pads PD3.

An area in which the first pads PD1 and the second pads PD2 are arranged may be referred to as a first pad area PA1, and an area in which the third pads PD3 are arranged may be referred to as a second pad area PA2. The first pad area PA1 may be bonded to the driving chip DC (refer to FIG. 1B), and the second pad area PA2 may be bonded to the circuit board. The first pad area PA1 may include a first area B1 in which the first pads PD1 are arranged and a second area B2 in which the second pads PD2 are arranged.

The first pad area PA1 and the second pad area PA2 may be spaced apart from each other in the first direction DR1. The second pads PD2 may be connected to a corresponding signal line and a corresponding power line among the signal lines DL, CSL1, and CSL2 and the power line VDL. The second pads PD2 may be connected to the third pads PD3 via connection lines S-CL. FIG. 3 shows one pad row in the first area B1 as a representative example, however, more pad rows may be arranged in the first area B1. The third pads PD3 may be bonded to the pads of the circuit board.

Figure 4:
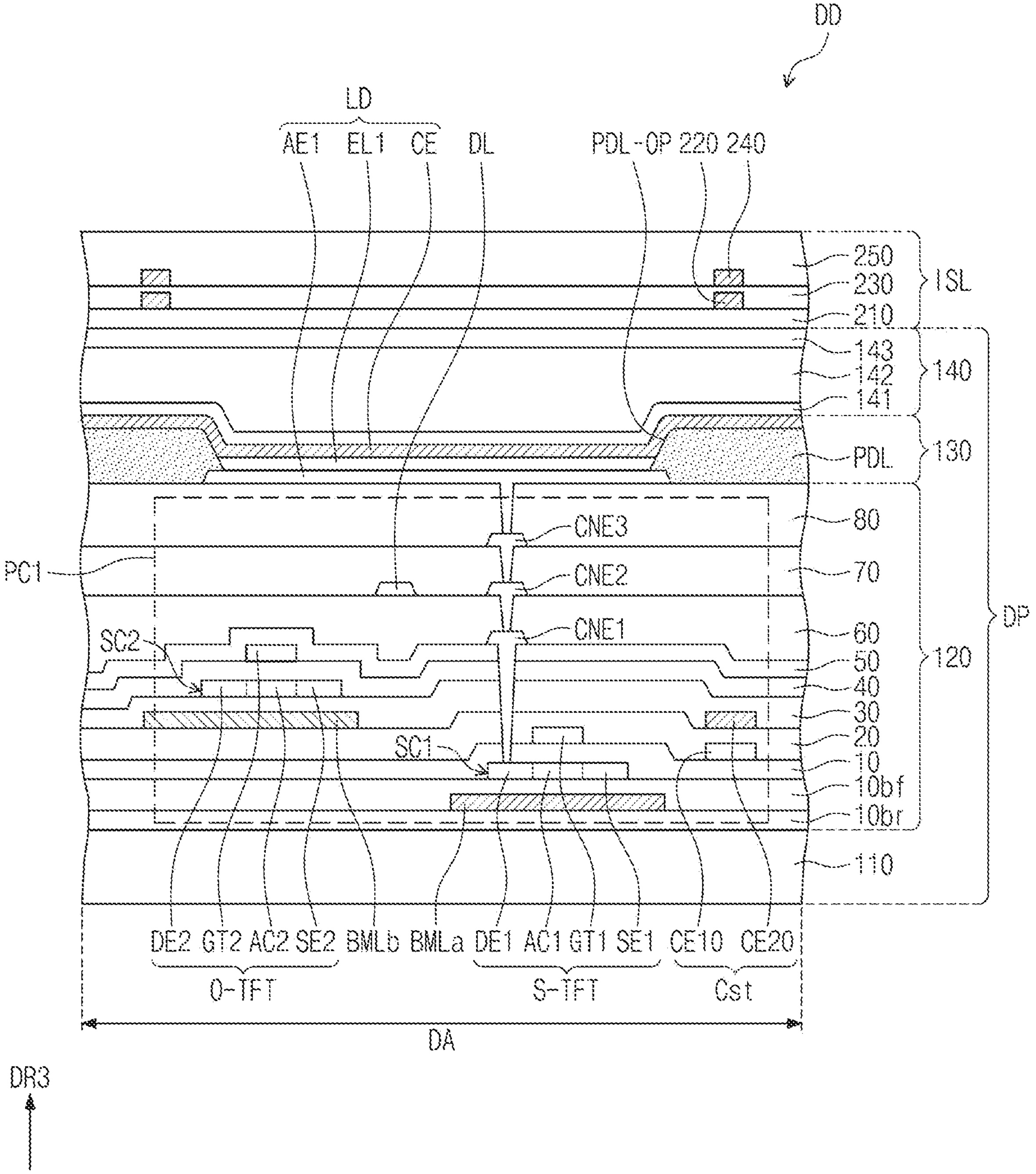
FIG. 4 is a first cross-sectional view of a display device according to some embodiments of the present disclosure.
Figure 5:
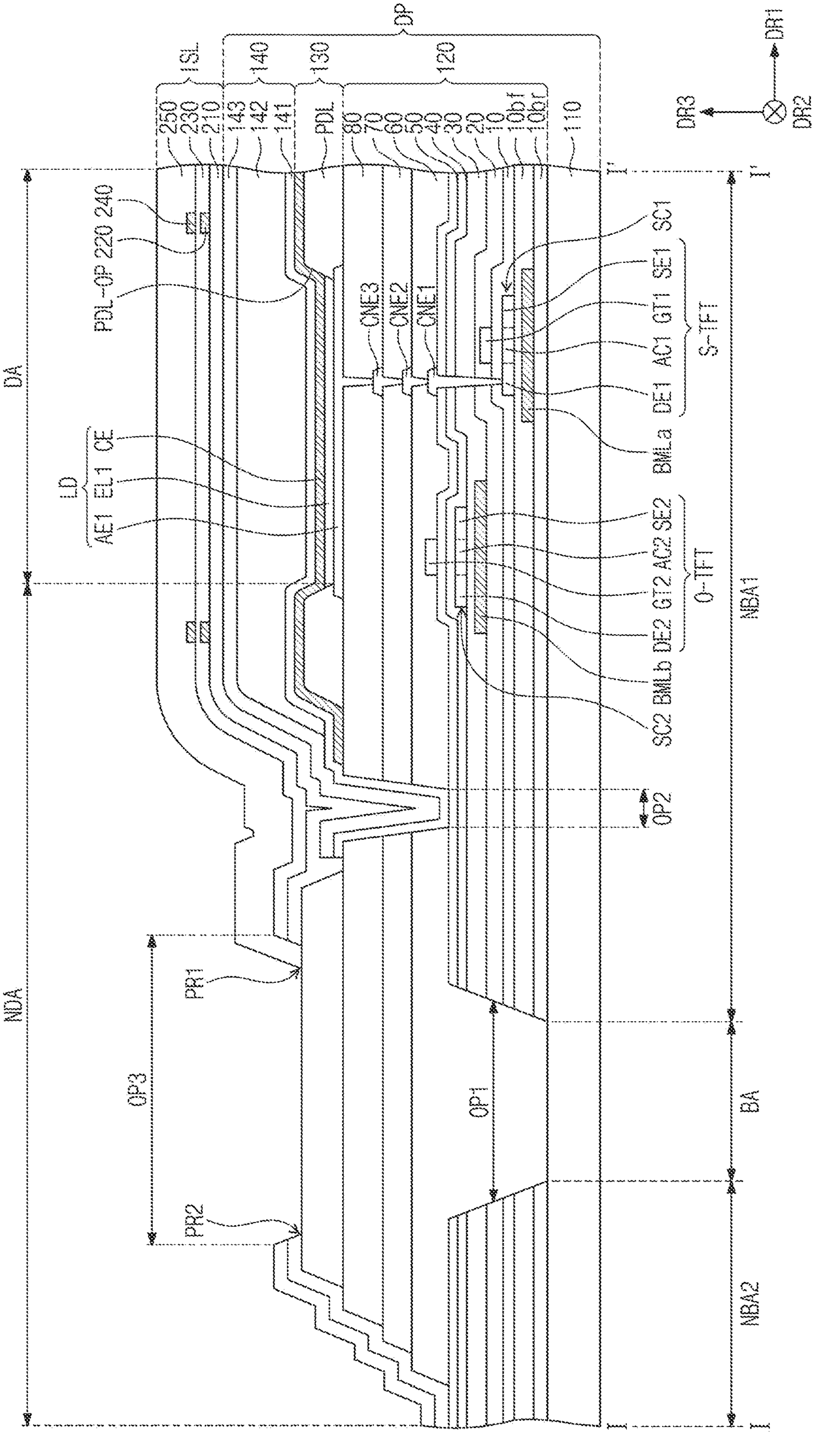
FIG. 5 is a second cross-sectional view of a display device according to some embodiments of the present disclosure.

FIG. 4 is a first cross-sectional view of the display device DD according to some embodiments of the present disclosure. FIG. 5 is a second cross-sectional view of the display device DD according to some embodiments of the present disclosure. FIG. 4 shows a cross-section corresponding to the pixel PX of FIG. 3, and FIG. 5 shows a cross-section taken along a line I-I' of FIG. 1A, which is centered on the insulating layer. In FIGS. 4 and 5, the thicknesses of insulating layers are illustrated differently from their actual thicknesses in order to explicitly show the insulating layers. In the insulating layers, inorganic layers have a thickness of about 10% to about 20% of a thickness of an organic layer.

FIG. 4 shows a portion of the light emitting element LD and a portion of a pixel circuit PC1. The silicon transistor S-TFT and the oxide transistor O-TFT are shown as a representative example of the pixel circuit PC1. According to some embodiments, the pixel circuit PC1 including both the silicon transistor S-TFT and the oxide transistor O-TFT will be described as a representative example, however, the pixel circuit PC1 may include only plural silicon transistors S-TFT or may include only plural oxide transistors O-TFT.

Referring to FIG. 4, a barrier layer 10*br* may be disposed on the base layer 110. The barrier layer 10*br* may prevent a foreign substance from entering thereinto from the outside. The barrier layer 10*br* may include at least one inorganic layer. The barrier layer 10*br* may include a silicon oxide layer and a silicon nitride layer. Each of the silicon oxide layer and the silicon nitride layer may be provided in plural, and the silicon oxide layers and the silicon nitride layers may be alternately stacked with each other.

A first shielding electrode BMLa may be disposed on the barrier layer 10*br*. The first shielding electrode BMLa may include a metal material. The first shielding electrode BMLa may include molybdenum (Mo), an alloy including molybdenum (Mo), titanium (Ti), or an alloy including titanium (Ti), which has a good heat resistance. The first shielding electrode BMLa may receive a bias voltage. The first shielding electrode BMLa may receive a power supply voltage. The first shielding electrode BMLa may prevent an electric potential caused by a polarization phenomenon from exerting influence on the silicon transistor S-TFT. The first shielding electrode BMLa may prevent an external light from reaching the silicon transistor S-TFT. According to some embodiments, the first shielding electrode BMLa may be a floating electrode isolated from other electrodes or lines.

A buffer layer 10*bf* may be disposed on the barrier layer 10*br*. The buffer layer 10*bf* may prevent metal atoms or impurities from being diffused to a first semiconductor pattern SC1 disposed thereon from the base layer 110. The buffer layer 10*bf* may include at least one inorganic layer. The buffer layer 10*bf* may include a silicon oxide layer and a silicon nitride layer.

The first semiconductor pattern SC1 may be disposed on the buffer layer 10*bf*. The first semiconductor pattern SC1 may include a silicon semiconductor. According to some embodiments, the silicon semiconductor may include amorphous silicon or polycrystalline silicon. For example, the first semiconductor pattern SC1 may include low temperature polycrystalline silicon.

FIG. 4 merely shows a portion of the first semiconductor pattern SC1, and the first semiconductor pattern SC1 may be further disposed in another area. The first semiconductor pattern SC1 may be arranged in a specific rule over the pixels. The first semiconductor pattern SC1 may have different electrical properties depending on whether it is doped or not. The first semiconductor pattern SC1 may include a first region having a relatively high conductivity and a second region having a relatively low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or a signal line. The second region may substantially correspond to a channel area (or an active area) of the transistor. In other words, a portion of the first semiconductor pattern SC1 may be a channel of the transistor, another portion of the first semiconductor pattern SC1 may be a source or a drain of the transistor, and the other portion of the first semiconductor pattern SC1 may be a connection electrode or a connection signal line.

A source area SE1, a channel area AC1 (or an active area), and a drain area DE1 of the silicon transistor S-TFT may be formed from the first semiconductor pattern SC1. The source area SE1 and the drain area DE1 may extend in opposite directions to each other from the channel area AC1 in a cross-section.

A first insulating layer 10 may be disposed on the buffer layer 10*bf*. The first insulating layer 10 may cover the first semiconductor pattern SC1. The first insulating layer 10 may be an inorganic layer. The first insulating layer 10 may have a single-layer structure of a silicon oxide layer. The first insulating layer 10 may have a multi-layer structure as well as the single-layer structure. An inorganic layer of the circuit element layer 120 described later may have a single-layer or multi-layer structure.

A gate GT1 of the silicon transistor S-TFT may be disposed on the first insulating layer 10. The gate GT1 may be a portion of a metal pattern. The gate GT1 may overlap the channel area AC1. The gate GT1 may be used as a mask in a process of doping the first semiconductor pattern SC1. A first electrode CE10 of a storage capacitor Cst may be disposed on the first insulating layer 10. According to some embodiments, the first electrode CE10 may be formed integrally with the gate GT1.

A second insulating layer 20 may be disposed on the first insulating layer 10 and may cover the gate GT1. According to some embodiments, an upper electrode may be disposed on the second insulating layer 20 and may overlap the gate GT1. A second electrode CE20 may be disposed on the second insulating layer 20 and may overlap the first electrode CE10.

A second shielding electrode BMLb may be disposed on the second insulating layer 20. The second shielding electrode BMLb may be disposed under the oxide transistor O-TFT. According to some embodiments, the second shielding electrode BMLb may be omitted. According to some embodiments, the first shielding electrode BMLa may extend to a lower side of the oxide transistor O-TFT to replace the second shielding electrode BMLb.

A third insulating layer 30 may be disposed on the second insulating layer 20. A second semiconductor pattern SC2 may be disposed on the third insulating layer 30. The second semiconductor pattern SC2 may include a channel area AC2 of the oxide transistor O-TFT. The second semiconductor pattern SC2 may include an oxide semiconductor. The second semiconductor pattern SC2 may include a transparent conductive oxide (TCO), such as indium tin oxide (ITO), indium zinc oxide (IZO), indium gallium zinc oxide (IGZO), zinc oxide (ZnOx), or indium oxide ($In_2O_3$).

The oxide semiconductor may include a plurality of areas distinguished from each other depending on whether a transparent conductive oxide is reduced. The area (hereinafter, referred to as a reduced area) in which the transparent conductive oxide is reduced has a conductivity greater than that of the area (hereinafter, referred to as a non-reduced area) in which the transparent conductive oxide is not reduced. The reduced area may substantially act as the source/drain of the transistor or the signal line. The non-reduced area may substantially correspond to the semiconductor area (or the channel) of the transistor. In other words, a portion of the second semiconductor pattern SC2 may be the semiconductor area of the transistor, another portion of the second semiconductor pattern SC2 may be the source area/drain area of the transistor, and the other portion of the second semiconductor pattern SC2 may be a signal transmission area.

A fourth insulating layer 40 may be disposed on the third insulating layer 30. As shown in FIG. 4, the fourth insulating layer 40 may cover the oxide transistor O-TFT. According to some embodiments, the fourth insulating layer 40 may overlap a gate GT2 of the oxide transistor O-TFT and may be an insulating pattern through which a source area SE2 and a drain area DE2 of the oxide transistor O-TFT are exposed.

The gate GT2 of the oxide transistor O-TFT may be disposed on the fourth insulating layer 40. The gate GT2 of the oxide transistor O-TFT may be a portion of a metal pattern. The gate GT2 of the oxide transistor O-TFT may overlap the channel area AC2.

A fifth insulating layer 50 may be disposed on the fourth insulating layer 40, and the fifth insulating layer 50 may cover the gate GT2. Each of the first to fifth insulating layers 10 to 50 may be an inorganic layer.

A first connection electrode CNE1 may be disposed on the fifth insulating layer 50. The first connection electrode CNE1 may be connected to the drain area DE1 of the silicon transistor S-TFT via a contact hole defined through the first, second, third, fourth, and fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 via a contact hole defined through the sixth insulating layer 60. The data line DL may be disposed on the sixth insulating layer 60. A seventh insulating layer 70 may be disposed on the sixth insulating layer 60 and may cover the second connection electrode CNE2 and the data line DL. A third connection electrode CNE3 may be disposed on the seventh insulating layer 70. The third connection electrode CNE3 may be connected to the second connection electrode CNE2 via a contact hole defined through the seventh insulating layer 70. An eighth insulating layer 80 may be disposed on the seventh insulating layer 70 and may cover the third connection electrode CNE3. Each of the sixth insulating layer 60, the seventh insulating layer 70, and the eighth insulating layer 80 may be an organic layer.

According to some embodiments, the circuit element layer 120 including seven conductive layers including the first shielding electrode BMLa, the gate GT1 of the silicon transistor S-TFT, the second shielding electrode BMLb, the gate GT2 of the oxide transistor O-TFT, the first connection electrode CNE1, the second connection electrode CNE2, and the third connection electrode CNE3 is shown as a representative example. Each of the first shielding electrode BMLa, the gate GT1 of the silicon transistor S-TFT, the second shielding electrode BMLb, the gate GT2 of the oxide transistor O-TFT, the first connection electrode CNE1, the second connection electrode CNE2, and the third connection electrode CNE3 may be respectively formed from a corresponding conductive layer by patterning first to seventh conductive layers. According to some embodiments, the number of the conductive layers may be changed. The circuit element layer 120 may include four to seven conductive layers.

The light emitting element LD may include an anode AE1 (or a first electrode), a light emitting layer EL1, and a cathode CE (or a second electrode). The cathode CE may be commonly provided in the light emitting elements of the pixels PX (refer to FIG. 3).

The anode AE1 of the light emitting element LD may be disposed on the eighth insulating layer 80. The anode AE1 may be a semi-transmissive electrode, a transmissive electrode, or a reflective electrode. The pixel definition layer PDL may have a light absorbing property, for example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof. The pixel definition layer PDL may correspond to a light blocking pattern having a light blocking property.

The pixel definition layer PDL may cover a portion of the anode AE1. As an example, the pixel definition layer PDL may be provided with an opening PDL-OP1 defined therethrough to expose a portion of the anode AE1.

According to some embodiments, a hole control layer may be disposed between the anode AE1 and the light emitting layer EL1. The hole control layer may include a hole transport layer and may further include a hole injection layer. An electron control layer may be disposed between the light emitting layer EL1 and the cathode CE. The electron control layer may include an electron transport layer and may further include an electron injection layer. The hole control layer and the electron control layer may be commonly formed over the plural pixels PX (refer to FIG. 3) using an open mask.

The thin film encapsulation layer 140 may be disposed on the light emitting element layer 130. The thin film encapsulation layer 140 may include an inorganic layer 141, an organic layer 142, and an inorganic layer 143, which are sequentially stacked, however, layers included in the thin film encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, it should not be limited thereto or thereby.

The input sensor ISL may be disposed on the display panel DP. The input sensor ISL may include at least one conductive layer and at least one insulating layer. According to some embodiments, the input sensor ISL may include a first input sensor insulating layer 210, a first conductive layer 220, a second input sensor insulating layer 230, a second conductive layer 240, and a third input sensor insulating layer 250.

The first input sensor insulating layer 210 may be disposed directly on the display panel DP. The first input sensor insulating layer 210 may be an inorganic layer including at least one of silicon nitride, silicon oxynitride, or silicon oxide. Each of the first conductive layer 220 and the second conductive layer 240 may have a single-layer structure or a multi-layer structure of layers stacked in the third direction DR3. The first conductive layer 220 and the second conductive layer 240 may include conductive lines to define electrodes having a mesh shape. The conductive line of the first conductive layer 220 may be connected to the conductive line of the second conductive layer 240 via a contact hole defined through the second input sensor insulating layer 230 or may not be connected. The connection relationship between the conductive line of the first conductive layer 220 and the conductive line of the second conductive layer 240 may be determined depending on a type of sensor applied to the input sensor ISL.

The first and second conductive layers 220 and 240 having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as PEDOT, metal nanowire, graphene, or the like.

The first and second conductive layers 220 and 240 having the multi-layer structure may include metal layers. The metal layers may have a three-layer structure of titanium/aluminum/titanium. The first and second conductive layers 220 and 240 having the multi-layer structure may include at least one metal layer and at least one transparent conductive layer.

The second input sensor insulating layer 230 may cover the first conductive layer 220. The second input sensor insulating layer 230 may include an inorganic layer including at least one of silicon nitride, silicon oxynitride, or silicon oxide. The third input sensor insulating layer 250 may cover the second conductive layer 240. The third input sensor insulating layer 250 may include an organic layer.

Referring to FIG. 5, the inorganic layers 10*br*, 10*bf*, and 10 to 50 may be disposed on the base layer 110. The inorganic layers 10*br*, 10*bf*, and 10 to 50 may include the barrier layer 10*br*, the buffer layer 10*bf*, and the first insulating layer 10 to the fifth insulating layer 50. The inorganic layers 10*br*, 10*bf*, and 10 to 50 may overlap the first area NBA1 and the third area NBA2. The inorganic layers 10*br*, 10*bf*, and 10 to 50 may be provided with an opening OP1 (hereinafter, referred to as a first opening) defined therethrough and corresponding to the second area BA. The first opening OP1 may be defined to prevent the inorganic layers 10*br*, 10*bf*, and 10 to 50 from being damaged due to a stress occurring when the second area BA is bent as shown in FIG. 1B. The first opening OP1 may be a groove extending in the second direction DR2 substantially parallel to the bending axis BX.

The organic layers 60, 70, 80, and PDL may be disposed on the inorganic layers 10*br*, 10*bf*, and 10 to 50. The organic layers 60, 70, 80, and PDL may include the sixth insulating layer 60 to the eighth insulating layer 80 and the pixel definition layer PDL. The first opening OP1 may be filled with the sixth insulating layer 60.

The sixth insulating layer 60 to the eighth insulating layer 80 may be provided with an opening OP2 (hereinafter, referred to as a second opening) defined therethrough and corresponding to the non-display area NDA of the first area NBA1. The second opening OP2 may extend in the second direction DR2, and the fifth insulating layer 50 may be exposed through the second opening OP2. The inorganic layers 141 and 143 of the thin film encapsulation layer 140 may be disposed in the second opening OP2 and may be in contact with the fifth insulating layer 50.

The first input sensor insulating layer 210 and the second input sensor insulating layer 230 of the input sensor ISL, which are the inorganic layer, may overlap the first area NBA1 and the third area NBA2. The first input sensor insulating layer 210 and the second input sensor insulating layer 230 of the input sensor ISL may be provided with an opening OP3 (hereinafter, referred to as a third opening) defined therethrough and corresponding to the second area BA. The third opening OP3 may be defined to prevent the first input sensor insulating layer 210 and the second input sensor insulating layer 230 of the input sensor ISL from being damaged due to a stress occurring when the second area BA is bent as shown in FIG. 1B. The third opening OP3 may extend in the second direction DR2. According to some embodiments, the third input sensor insulating layer 250 of the input sensor ISL, which is the organic layer, may overlap the first area NBA1 and may not overlap the second area BA and the third area NBA2, however, the present disclosure should not be limited thereto or thereby.

Figure 6:
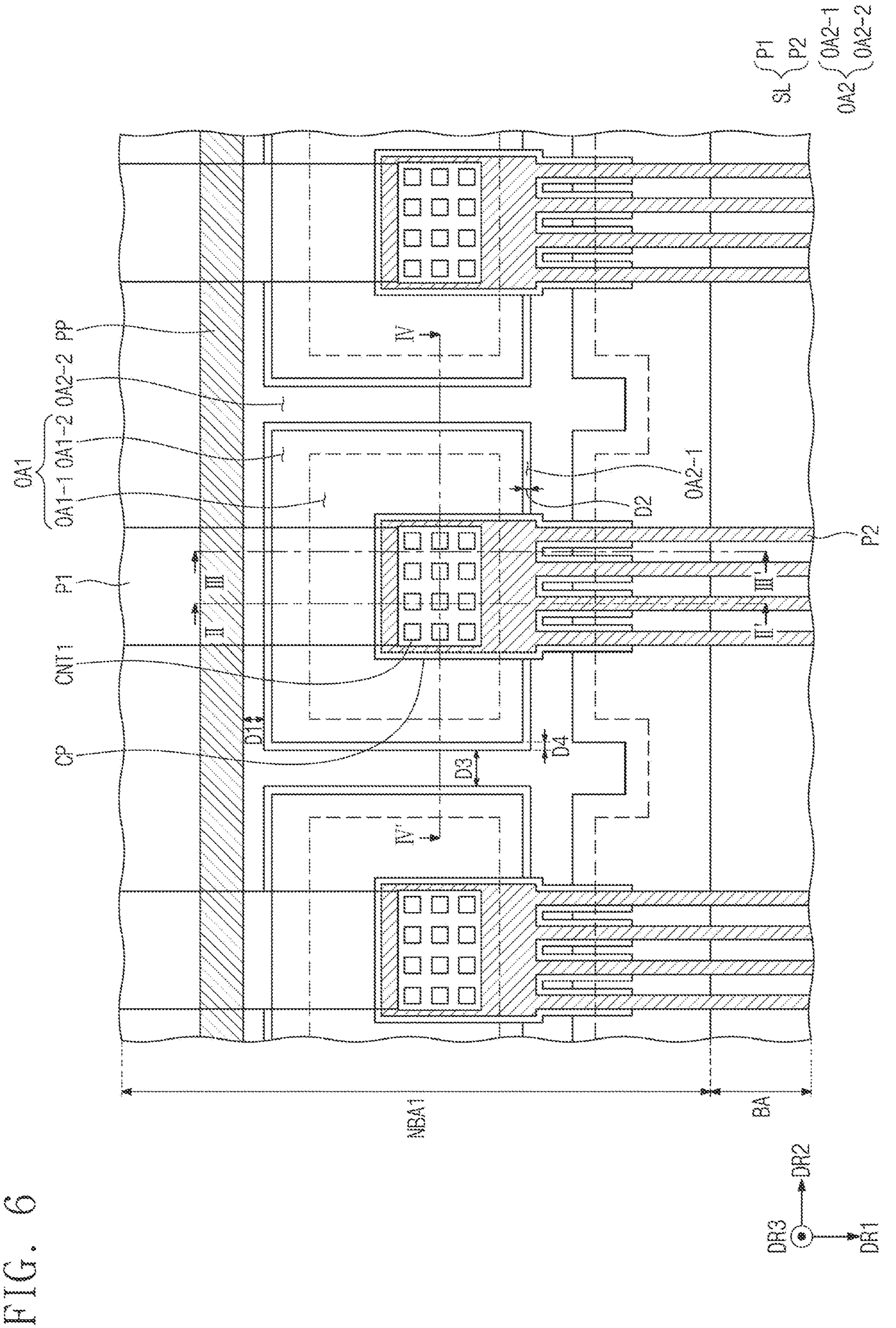
FIG. 6 is an enlarged plan view of an area AA of FIG. 3 according to some embodiments of the present disclosure.
Figure 7:
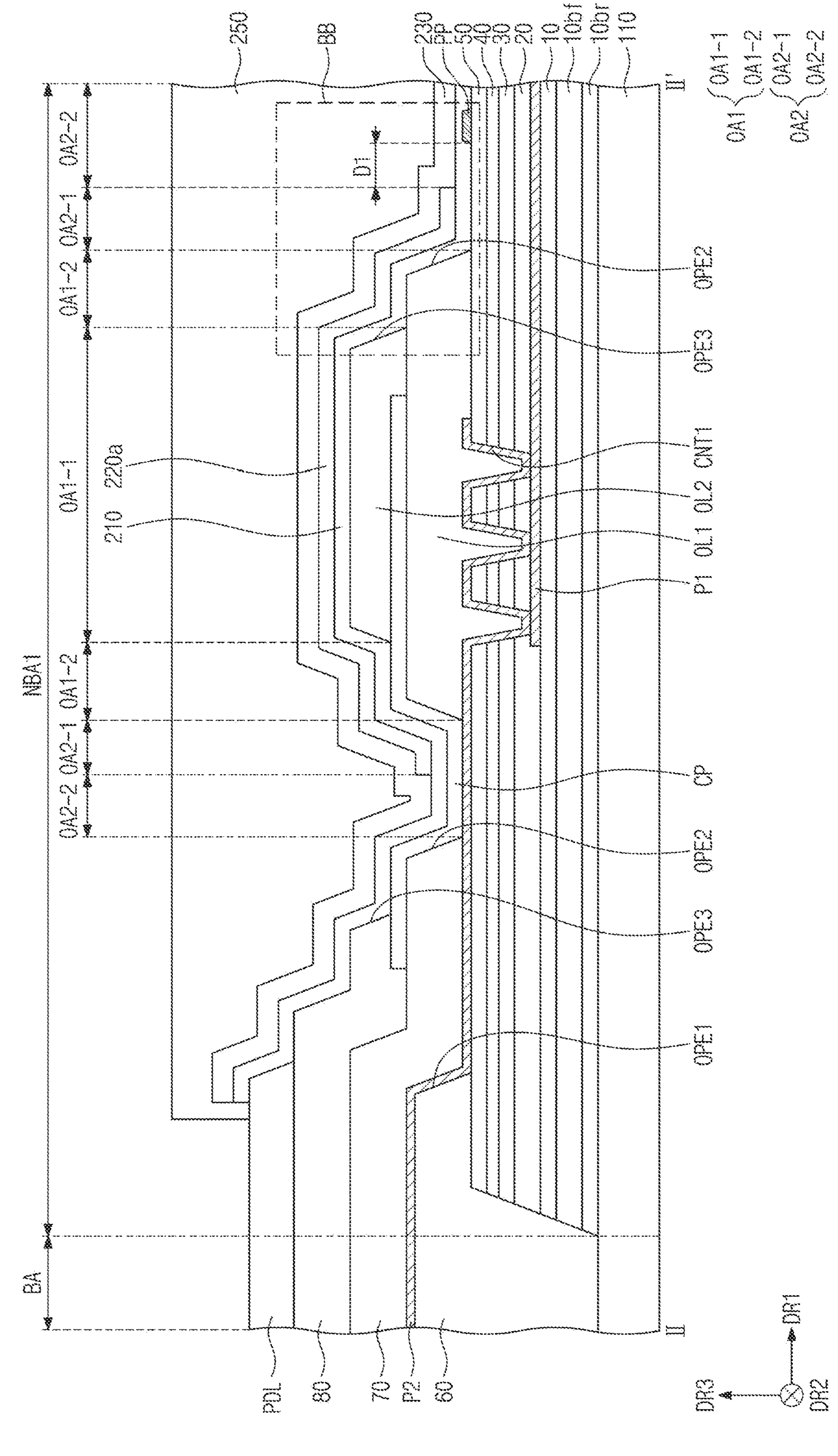
FIG. 7 is a cross-sectional view taken along a line II-II of FIG. 6 according to some embodiments of the present disclosure.

FIG. 6 is an enlarged plan view of an area AA of FIG. 3 according to some embodiments of the present disclosure. FIG. 7 is a cross-sectional view taken along a line II-II of FIG. 6 according to some embodiments of the present disclosure.

Referring to FIGS. 6 and 7, a lower inorganic layer disposed at an uppermost position among lower inorganic layers 10*br*, 10*bf*, 10, 20, 30, 40, and 50 may include a first portion area OA1 and a second portion area OA2. Organic patterns OL1 and OL2 (refer to FIG. 7) may be disposed in the first portion area OA1. The organic patterns OL1 and OL2 may not be disposed in the second portion area OA2.

The second portion area OA2 may surround the first portion area OA1. As described above, since the second portion area OA2 in which the organic patterns OL1 and OL2 are not disposed surrounds the first portion area OA1 in which the organic patterns OL1 and OL2 are disposed, the organic patterns may prevent a transmission of substances that cause corrosion of a signal line SL. The organic patterns OL1 and OL2 disposed in the first portion area OA1 may be spaced apart from the organic patterns OL1 and OL2 disposed in another adjacent first portion area OA1 by the second portion area OA2, and thus, the transmission of substances that cause corrosion through the organic patterns OL1 and OL2 may be prevented.

The first portion area OA1 may include a first-first portion area OA1-1 and a first-second portion area OA1-2. At least one contact hole CNT1 may be defined through the first portion area OA1. The first-second portion area OA1-2 may surround the first-first portion area OA1-1. The first-second portion area OA1-2 may have an annular shape whose inner portion corresponding to the first portion area OA1 is hollowed out.

The second portion area OA2 may include a second-first portion area OA2-1 and a second-second portion area OA2-2. The second-first portion area OA2-1 may surround the first-second portion area OA1-2. The second-first portion area OA2-1 may have an annular shape whose inner portion corresponding to the first-second portion area OA1-2 is hollowed out. The second-second portion area OA2-2 may be defined adjacent to the second-first portion area OA2-1. The second-second portion area OA2-2 may surround a boundary of the second-first portion area OA2-1.

The signal line SL shown in FIG. 6 may correspond to the data lines DL or the signal transmission lines CSL1 and CSL2 described with reference to FIG. 3. The signal line SL is not limited to the data lines DL and the signal transmission lines CSL1 and CSL2. For the signal line SL according to some embodiments, it is sufficient that structural characteristics, which are described below, are satisfied.

The signal line SL may be electrically connected to the pixel PX (refer to FIG. 3). The signal line SL may include a first line portion P1 and a second line portion P2. The first line portion P1 and the second line portion P2 may be disposed on different layers from each other. The signal line SL may overlap the first area NBA1, the second area BA, and the third area NBA2 (refer to FIG. 3). The signal line SL may extend in the first direction DR1.

The first line portion P1 may be disposed in the first area NBA1 and may extend from the display area DA of FIG. 3 to a lower side of the first area NBA1. The first line portion P1 may be disposed on the first insulating layer 10 among the lower inorganic layers 10*br*, 10*bf*, 10, 20, 30, 40, and 50.

The first line portion P1 may be covered by the second insulating layer 20. The first line portion P1 may be connected to the second line portion P2 via the contact hole CNT1 defined through the lower side of the first area NBA1. The first line portion P1 and the gate GT1 of the silicon transistor S-TFT of FIG. 4 may be disposed on the same layer as each other. In the present disclosure, the expression "the first line portion P1 and the gate GT1 are disposed on the same layer" means that they are formed by the same process and that they have the same material and the same stacked structure.

The second line portion P2 may be disposed on a layer different from a layer on which the first line portion P1 is disposed and may be connected to the first line portion P1 via the contact hole CNT1. The second line portion P2 overlapping the first portion area OA1 and the second portion area OA2 may be disposed on the fifth insulating layer 50. A portion of the second line portion P2, which is adjacent to the second area BA, may be disposed on the sixth insulating layer 60. The second line portion P2 may be formed through the same process as and may include the same material as the second connection electrode CNE2 of FIG. 4. However, since the sixth insulating layer 60 is not disposed in the first portion area OA1 and the second portion area OA2, the second line portion P2 overlapping the first portion area OA1 and the second portion area OA2 may be disposed directly on the fifth insulating layer 50. As a first groove OPE1 is defined through the sixth insulating layer 60 so as to overlap the first portion area OA1 and the second portion area OA2, the organic pattern formed through the same process as the sixth insulating layer 60 may not be formed in the first portion area OA1 and the second portion area OA2.

The second line portion P2 may extend from an end of the first line portion P1 to the second area BA (refer to FIG. 3) along a direction parallel to the first direction DR1. The second line portion P2 may overlap the lower side of the first area NBA1, the second area BA, and the third area NBA2.

The second line portion P2 may be disposed on the first line portion P1. The second line portion P2 may overlap the first area NBA1 and the second area BA. The second line portion P2 may be connected to the first line portion P1 via the contact hole CNT1 defined through the first-first portion area OA1-1. The contact hole CNT1 may be defined through the second to fifth insulating layers 20 to 50 disposed between the first line portion P1 and the second line portion P2.

The second line portion P2 may be divided into a plurality of lines, and the lines may extend to the second area BA. The lines divided from the second line portion P2 may extend in a direction parallel to the first direction DR1. The lines divided from the second line portion P2 may be arranged in the second direction DR2 and may be spaced apart from each other at intervals (e.g., set or predetermined intervals). FIG. 6 shows a structure in which the second line portion P2 is divided into four lines, however, this is merely an example, and the number of the lines may be changed as necessary.

A protective conductive pattern CP may overlap the first area NBA1 and may cover a portion of the second line portion P2 when viewed in the plane. The protective conductive pattern CP may extend in a direction substantially parallel to the direction in which the first line portion P1 and the second line portion P2 extend. The protective conductive pattern CP may cover the portion of the second line portion P2, which is disposed adjacent to the contact hole CNT1 when viewed in the plane. The protective conductive pattern CP may be divided into a plurality of line protective patterns, and the line protective patterns may respectively overlap and protect the lines divided from the second line portion P2.

The protective conductive pattern CP may overlap the second portion area OA2. Since the organic patterns OL1 and OL2 are not formed in the second portion area OA2, the second line portion P2 overlapping the second portion area OA2 may be exposed to the outside when the seventh insulating layer 70 is formed. In this case, when an etching process is performed, a portion of the second line portion P2 may be etched. Therefore, when the protective conductive pattern CP is formed to cover the second line portion P2, the second line portion P2 may be prevented from being etched.

A portion of the protective conductive pattern CP may be disposed between a first pattern OL1 and a second pattern OL2. The protective conductive pattern CP may be formed through the same process as and may include the same material as the third connection electrode CNE3 of FIG. 4.

A power line PP may extend in a direction crossing the first line portion P1. The power line PP may overlap the first area NBA1. The power line PP may correspond to the power line VDL of FIG. 3. The power line PP may be disposed closer to the display area DA (refer to FIG. 3) than the second line portion P2 is. That is, the power line PP may be disposed further away from the second area BA than the second line portion P2 is.

The power line PP may be disposed on the fifth insulating layer 50. The power line PP may be formed through the same process as and may include the same material as the third connection electrode CNE3 of FIG. 4. The power line PP may be formed through the same process as the protective conductive pattern CP. However, since the organic patterns OL1 and OL2 are not disposed in the area in which the power line PP is located, the power line PP may be disposed on the fifth insulating layer 50.

The organic patterns OL1 and OL2 may be disposed on the fifth insulating layer 50 that is the lower inorganic layer disposed at the uppermost position among the lower inorganic layers 10*br*, 10*bf*, 10, 20, 30, 40, and 50. The organic patterns OL1 and OL2 may be disposed on an area where the first line portion P1 is connected to the second line portion P2 in the non-display area NDA. The organic patterns OL1 and OL2 may overlap the first portion area OA1.

The organic patterns OL1 and OL2 may include the first pattern OL1 (or first organic pattern) and the second pattern OL2 (or second organic pattern). The first pattern OL1 may overlap the first-first portion area OA1-1 and the second portion area OA2. The first pattern OL1 may be formed through the same process as and may include the same material as the seventh insulating layer 70. The first pattern OL1 may be spaced apart from the seventh insulating layer 70 with a second groove OPE2 defined through the seventh insulating layer and interposed therebetween.

The first pattern OL1 may be disposed on the fifth insulating layer 50. The first pattern OL1 may cover the second line portion P2 overlapping the first portion area OA1. The first pattern OL1 may surround the contact hole CNT1 when viewed in the plane. The first pattern OL1 may have a quadrangular shape when viewed in the plane. However, the shape of the first pattern OL1 in the plane should not be limited thereto or thereby.

The second pattern OL2 may be disposed on the first pattern OL1 and may be disposed inside the first pattern OL1 when viewed in the plane. The second pattern OL2 may overlap the first-first portion area OA1-1. The second pattern OL2 may cover the protective conductive pattern CP overlapping the first-first portion area OA1-1. The second pattern OL2 may have a quadrangular shape when viewed in the plane. However, the shape of the second pattern OL2 in the plane should not be limited thereto or thereby.

The second pattern OL2 may be formed through the same process as and may include the same material as the eighth insulating layer 80. The second pattern OL2 may be spaced apart from the eighth insulating layer 80 with a third groove OPE3 defined through the eighth insulating layer 80 and interposed therebetween.

The first input sensor insulating layer 210 that is an upper inorganic layer may cover the first portion area OA1 and the second portion area OA2. When viewed in the plane, the first input sensor insulating layer 210 may cover the organic patterns OL1 and OL2. The first input sensor insulating layer 210 may cover an upper surface and an outer side surface of the organic patterns OL1 and OL2. The first input sensor insulating layer 210 may cover the power line PP. The first input sensor insulating layer 210 may cover the protective conductive pattern CP overlapping the second portion area OA2.

A conductive pattern 220*a* may be disposed on the first input sensor insulating layer 210 that is the upper inorganic layer and may cover the organic patterns OL1 and OL2 when viewed in the plane. The conductive pattern 220*a* may be formed through the same process as and may include the same material as the first conductive layer 220 of FIG. 4. The conductive pattern 220*a* may cover the upper surface of the organic patterns OL1 and OL2.

A lower surface of the organic patterns OL1 and OL2 may be encapsulated by the fifth insulating layer 50 that is the lower inorganic layer, and the upper surface of the organic patterns OL1 and OL2 may be encapsulated by the first input sensor insulating layer 210 that is the upper inorganic layer and the conductive pattern 220*a*. Accordingly, the transmission of substances that cause corrosion to the signal line SL may be prevented by the organic patterns OL1 and OL2.

The conductive pattern 220*a* may overlap the first portion area OA1 and may overlap the second-first portion area OA2-1 that is a portion of the second portion area OA2. The conductive pattern 220*a* may be spaced apart from the organic patterns OL1 and OL2 by a distance equal to or greater than about 1 μm and equal to or smaller than about 3 μm when viewed in the plane.

A distance D1 between the conductive pattern 220*a* and the power line PP in the plane may be equal to or greater than about 4 μm and equal to or smaller than about 7 μm. When the distance D1 between the conductive pattern 220*a* and the power line PP in the plane is smaller than about 4 μm, the conductive pattern 220*a* may be connected to the power line PP, and a short circuit may occur in the power line PP. When the distance D1 between the conductive pattern 220*a* and the power line PP in the plane is greater than about 7 μm, the upper surface of the organic patterns OL1 and OL2 may not be sufficiently covered. According to some embodiments, the distance D1 between the conductive pattern 220a and the power line PP may be about 5 μm when viewed in the plane.

Figure 8A:
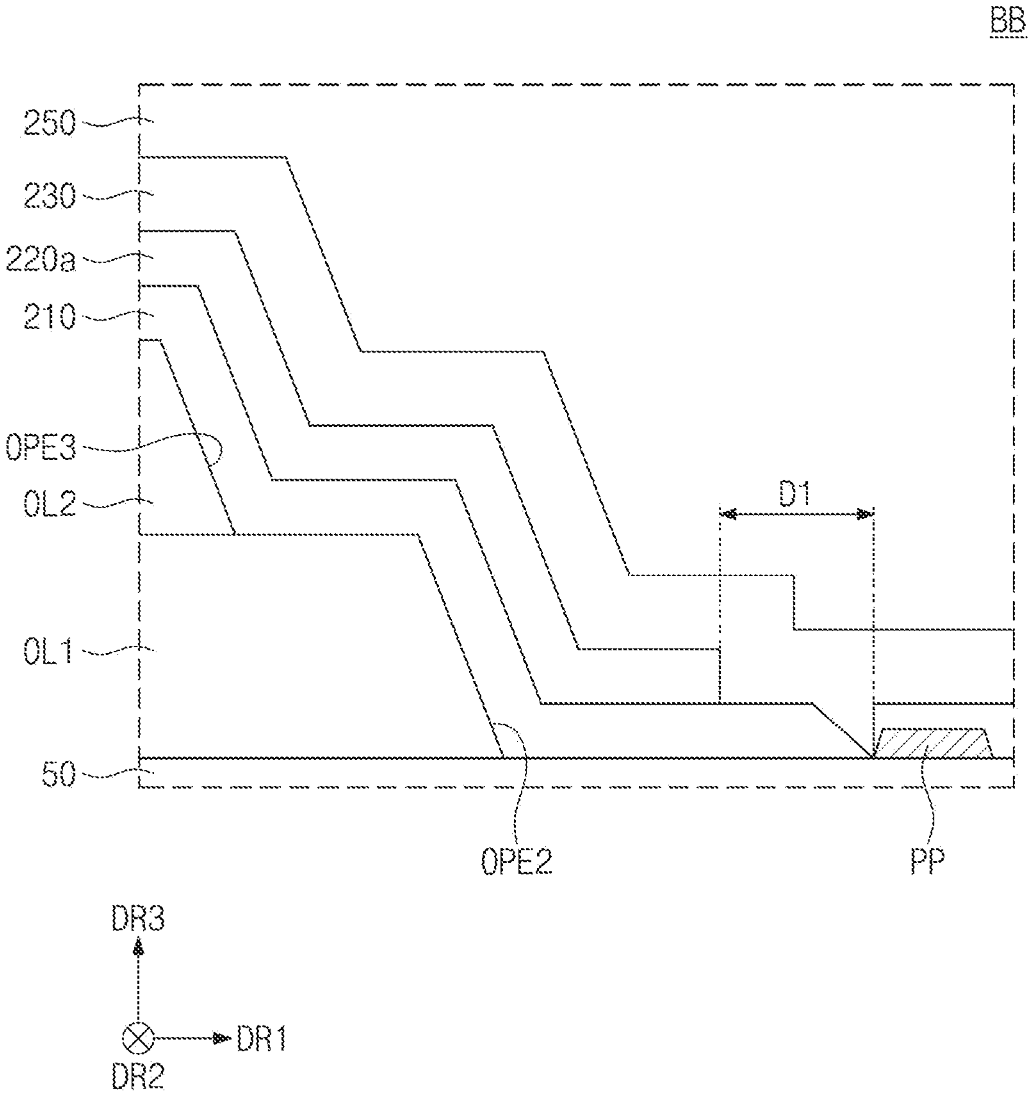
FIGS. 8A and 8B are enlarged cross-sectional views of an area BB of FIG. 7 according to some embodiments of the present disclosure and a comparative example.
Figure 8B:
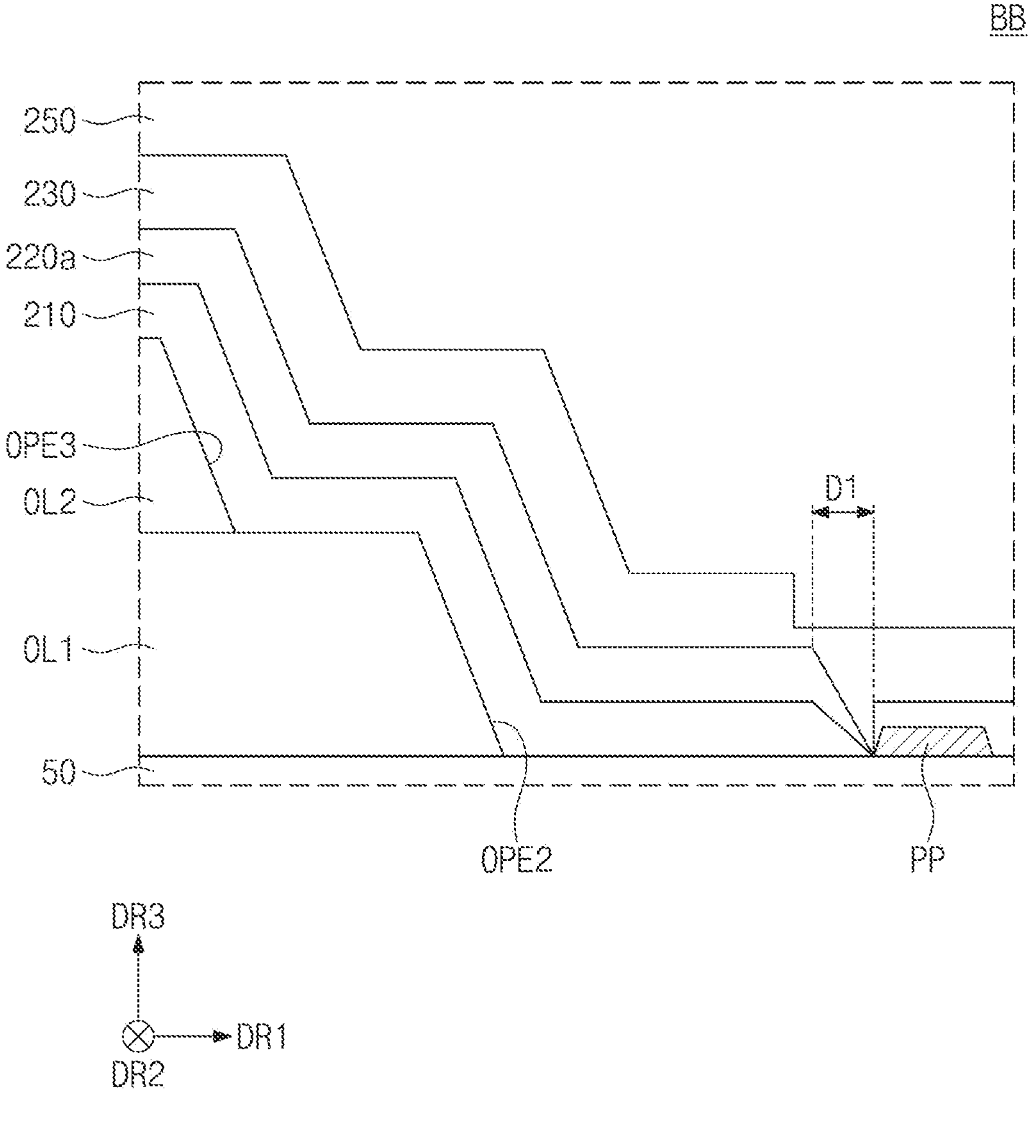

FIG. 8A is and enlarged cross-sectional view of an area BB of FIG. 7 according to some embodiments. FIG. 8B is an enlarged cross-sectional view of an area BB of FIG. 7 according to a comparative example.

Referring to FIG. 8A, an end of the conductive pattern 220a may be spaced apart from the power line PP by a first distance D1. Since the first distance D1 is equal to or greater than about 4 μm, the end of the conductive pattern 220a may be sufficiently spaced apart from the power line PP. Even though there is a gap between the power line PP and the first input sensor insulating layer 210, the conductive pattern 220a and the power line PP may not be short-circuited with each other.

Referring to FIG. 8B, a first distance D1 between the conductive pattern 220a and the power line PP according to the comparative example is smaller than about 4 μm. In this case, a conductive pattern 220a may be formed in a gap between the power line PP and the first input sensor insulating layer 210, and thus, the power line PP may be short-circuited with the first input sensor insulating layer 210.

Figure 9:
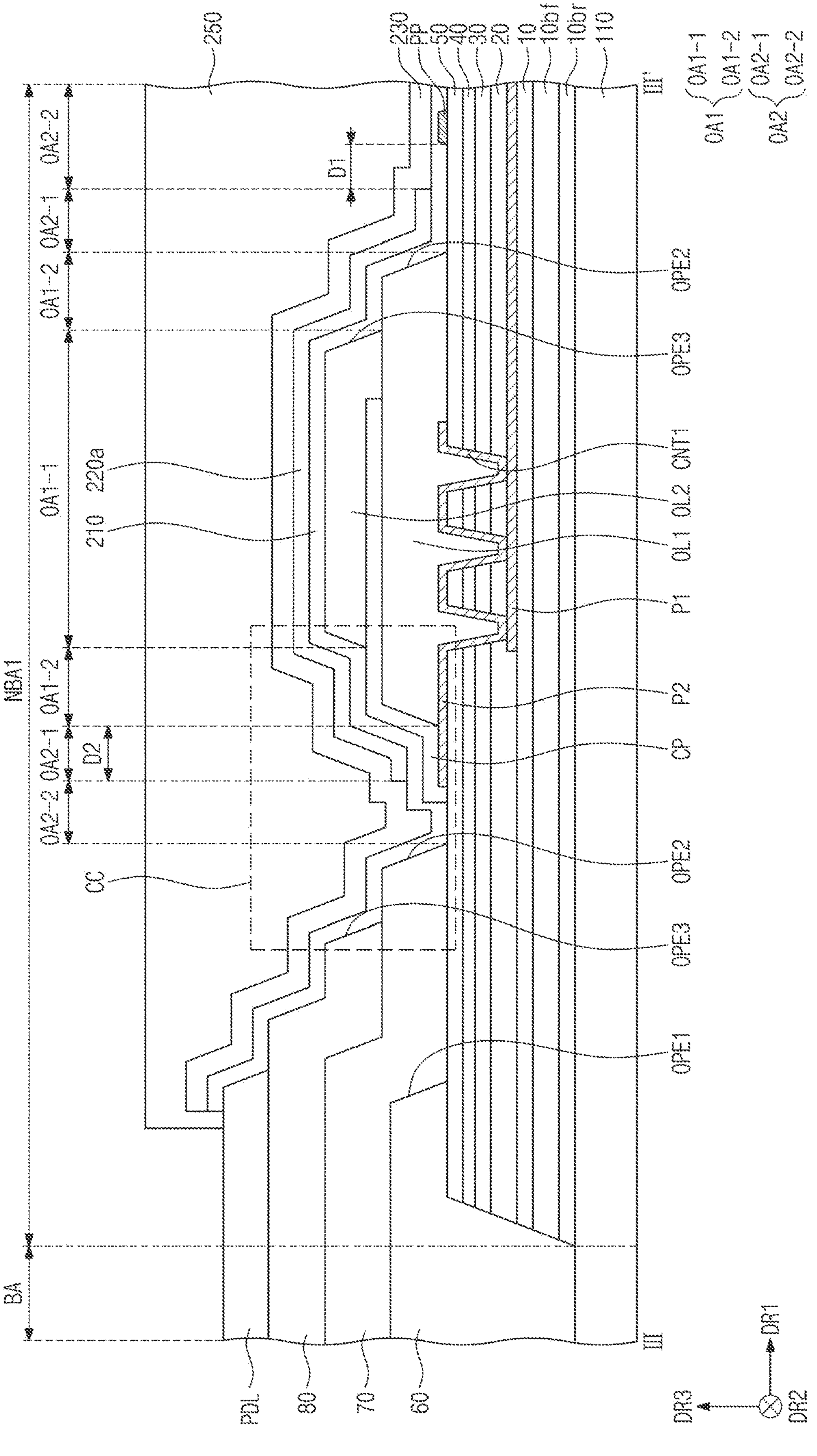
FIG. 9 is a cross-sectional view taken along a line III-III' of FIG. 6 according to some embodiments of the present disclosure.

FIG. 9 is a cross-sectional view taken along a line III-III' of FIG. 6 according to some embodiments of the present disclosure.

Referring to FIGS. 6 and 9, the second line portion P2 may be divided into the lines, and the lines may extend in the first direction DR1. The protective conductive pattern CP may be divided into the line protective patterns and may extend in the first direction DR1. In FIG. 9, an end of the second line portion P2, which is adjacent to the second-first portion area OA2-1, may be a point at which the second line portion P2 of FIG. 6 is divided. In FIG. 9, an end of the protective conductive pattern CP, which is adjacent to the second-first portion area OA2-1, may be a point at which the protective conductive pattern CP of FIG. 6 is divided.

The end of the conductive pattern 220a may be disposed further away from the second area BA than the point at which the second line portion P2 is divided is. Referring to FIGS. 6 and 7, a lower end of the second-first portion area OA2-1, which corresponds to the conductive pattern 220a, may be disposed at an upper position than the point at which the second line portion P2 is divided. Accordingly, since the conductive pattern 220a is not disposed at the point where the short circuit with the second line portion P2 is likely to occur, the possibility of a short circuit between the second line portion P2 and the conductive pattern 220a may be reduced.

Figure 10A:
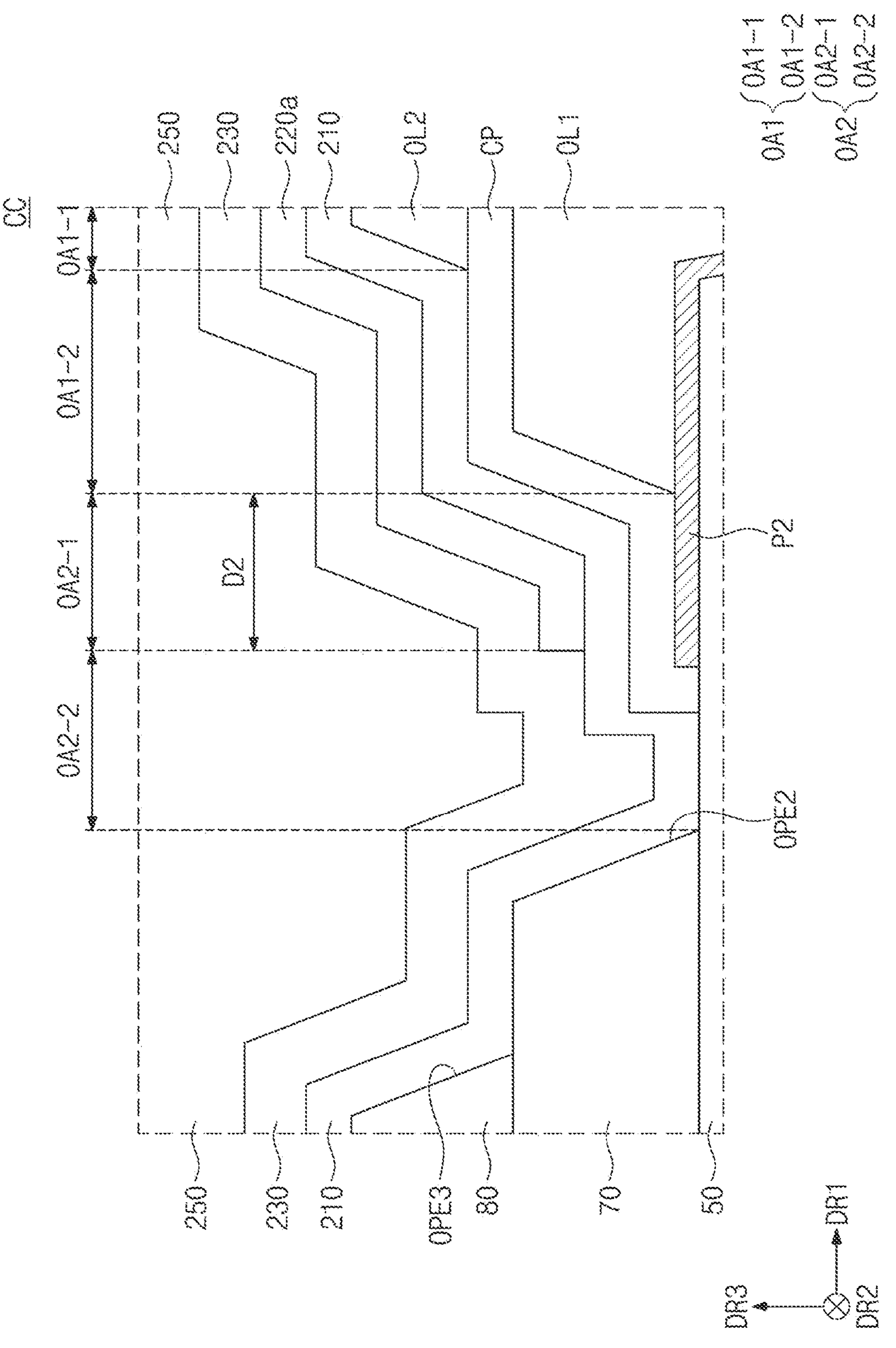
FIGS. 10A and 10B are enlarged cross-sectional views of an area CC of FIG. 9 according to some embodiments of the present disclosure and a comparative example.
Figure 10B:
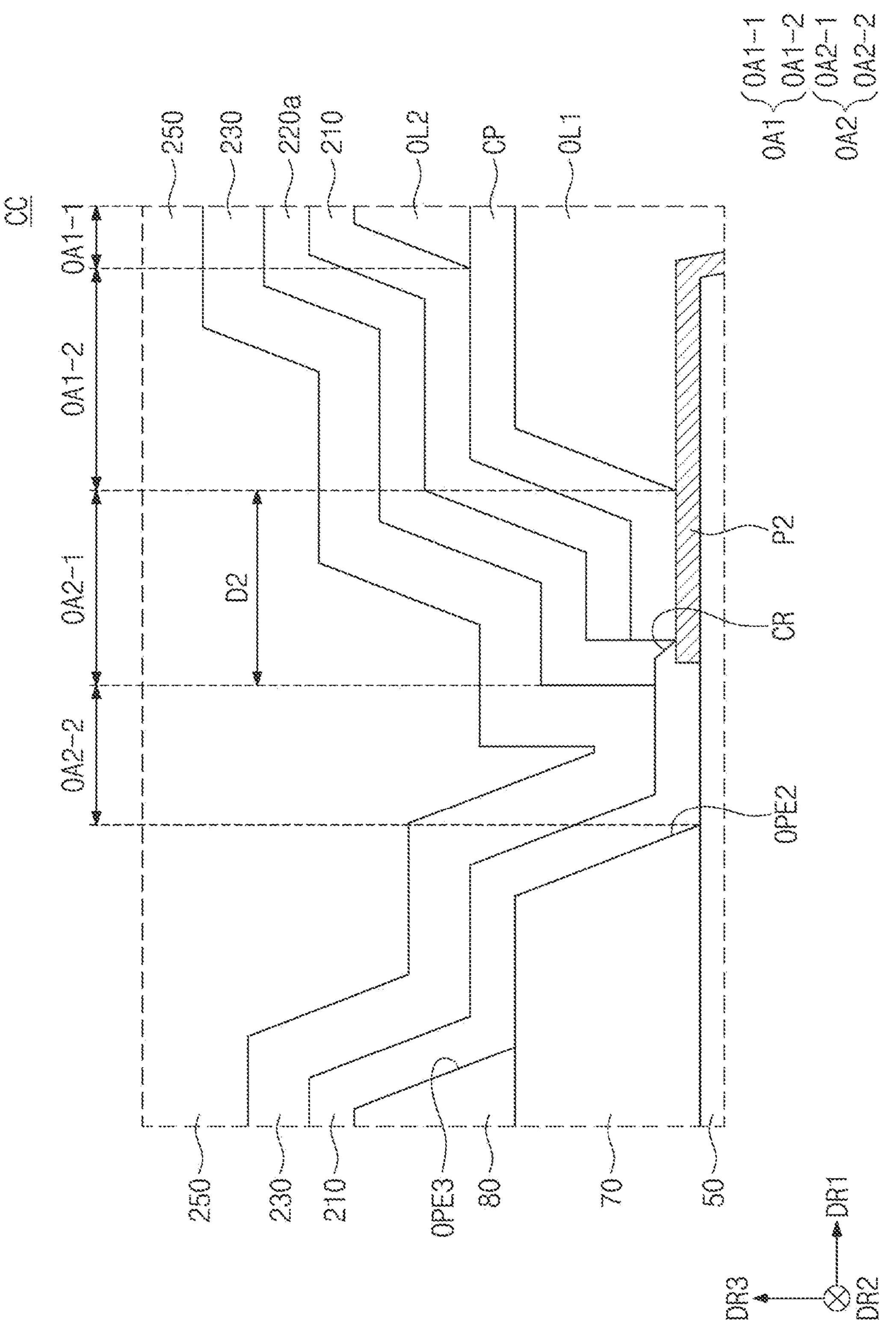

FIG. 10A is an enlarged cross-sectional view of an area CC of FIG. 9 according to some embodiments of the present disclosure. FIG. 10B is an enlarged cross-sectional view of an area CC of FIG. 9 according to a comparative example.

Referring to FIG. 10A, a second distance D2 between the end of the conductive pattern 220a and the organic patterns OL1 and OL2 in the first direction DR1 may be equal to or greater than about 1 μm and equal to or smaller than about 3 μm. When the second distance D2 is smaller than about 1 μm, the upper surface of the organic pattern OL1 and OL2 may not be sufficiently encapsulated by the conductive pattern 220a. Referring to FIG. 10B, a second distance D2 between an end of a conductive pattern 220a and organic patterns OL1 and OL2 in the first direction DR1 according to the comparative example may be greater than about 3 μm. A step difference with a large slope may occur in a first input sensor insulating layer 210 adjacent to an end of the second line portion P2, and thus, a gap penetrating the first input sensor insulating layer 210 and a protective conductive pattern CP may occur. As shown in FIG. 10B, since the conductive pattern 220a is formed in the gap, the conductive pattern 220a may be short-circuited with the second line portion P2.

Figure 11:
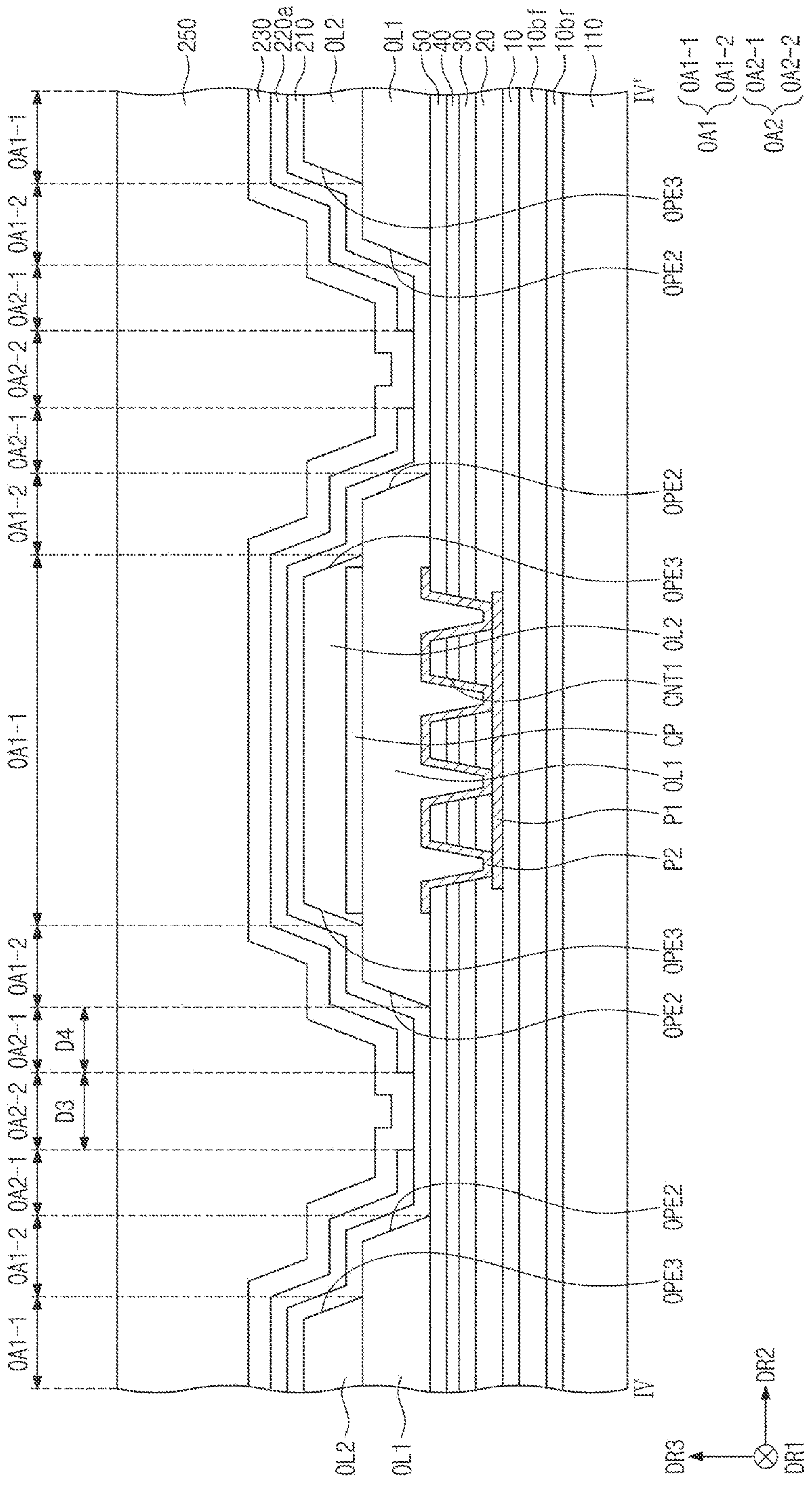
FIG. 11 is a cross-sectional view taken along a line IV-IV' of FIG. 6 according to some embodiments of the present disclosure.

FIG. 11 is a cross-sectional view taken along a line IV-IV' of FIG. 6 according to some embodiments of the present disclosure.

Referring to FIGS. 6 and 11, each of the organic patterns OL1 and OL2 and a conductive pattern 220a may be provided in plural.

A third distance D3 between ends of the conductive patterns 220a adjacent to each other may be equal to or greater than about 6 μm and equal to or smaller than about 10 μm when viewed in the plane. When the third distance D3 is smaller than about 6 μm, the third distance D3 between the conductive patterns 220a becomes too small, so the signal lines SL may be electrically connected to each other. When the third distance D3 is greater than about 10 μm, the end of the conductive pattern 220a becomes closer to the end of the organic patterns OL1 and OL2, and as a result, an upper surface of the organic pattern OL1 and OL2 may not be sufficiently encapsulated by the conductive pattern 220a. According to some embodiments, the third distance D3 may be about 7 μm.

A fourth distance D4 between the end of the conductive pattern 220a and the organic patterns OL1 and OL2 in the second direction DR2 may be equal to or greater than about 1 μm and equal to or smaller than about 3 μm. When the fourth distance D4 is smaller than about 1 μm, the upper surface of the organic patterns OL1 and OL2 may not be sufficiently encapsulated by the conductive pattern 220a. When the fourth distance D4 is greater than about 3 μm, a distance between the conductive patterns 220a adjacent to each other becomes too small, and the conductive patterns 220a adjacent to each other may be connected to each other. According to some embodiments, the fourth distance D4 may be about 2 μm.

Figure 12:
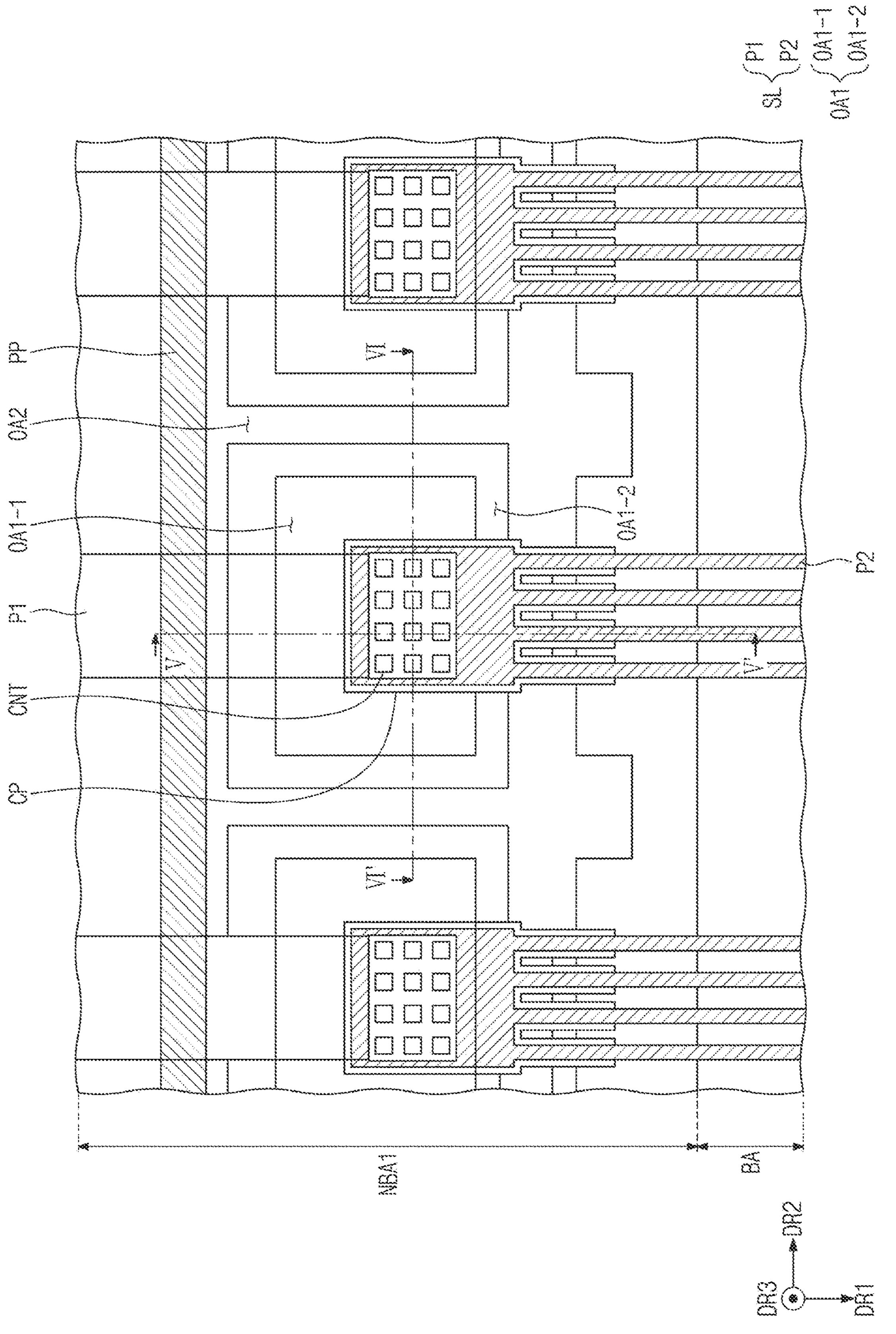
FIG. 12 is an enlarged plan view of an area AA of FIG. 3 according to some embodiments of the present disclosure.
Figure 13:
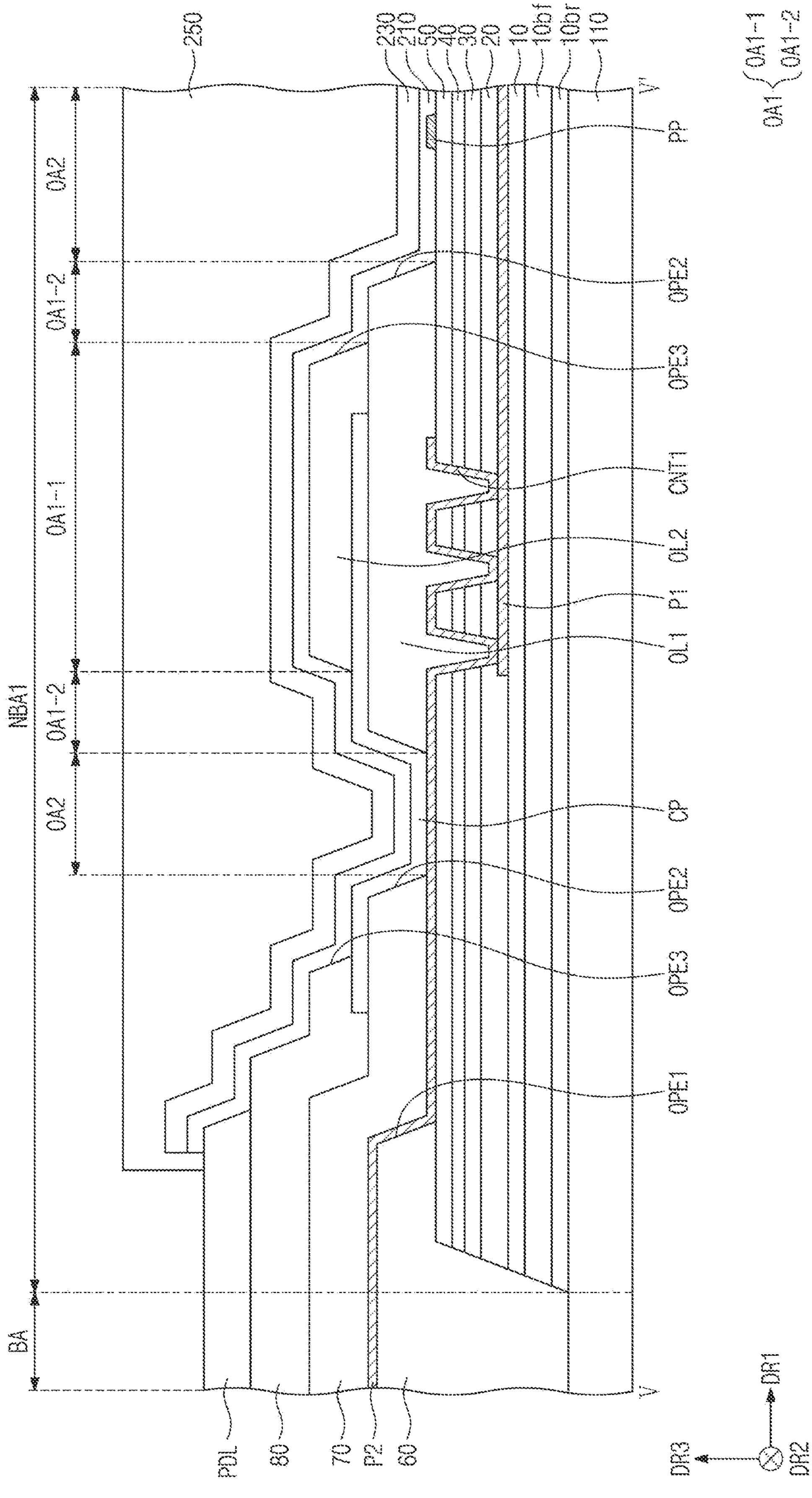
FIG. 13 is a cross-sectional view taken along a line V-V' of FIG. 12 according to some embodiments of the present disclosure.
Figure 14:
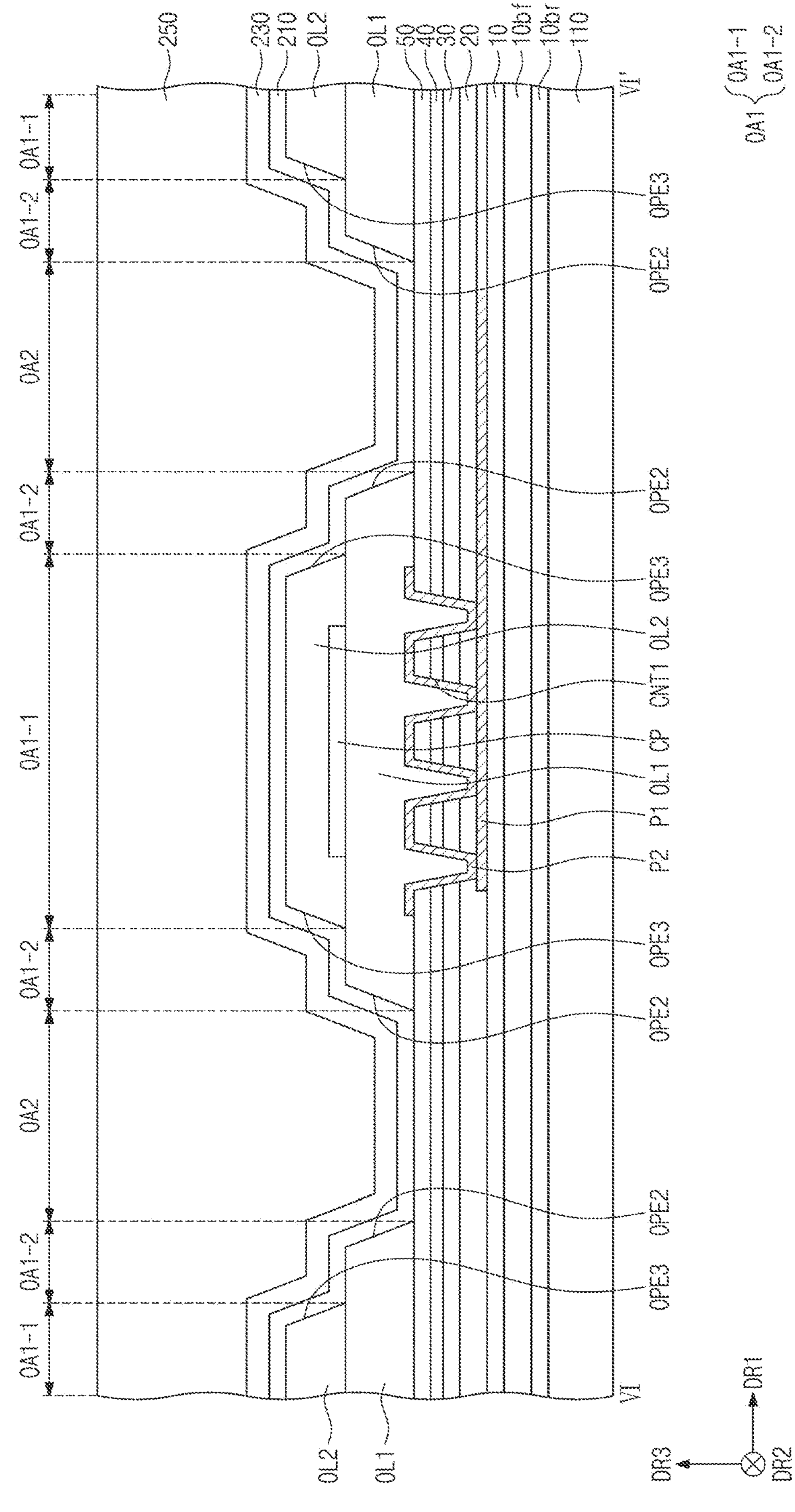
FIG. 14 is a cross-sectional view taken along a line VI-VI' of FIG. 12 according to some embodiments of the present disclosure.

FIG. 12 is an enlarged plan view of an area AA of FIG. 3 according to some embodiments of the present disclosure. FIG. 13 is a cross-sectional view taken along a line V-V' of FIG. 12 according to some embodiments of the present disclosure. FIG. 14 is a cross-sectional view taken along a line VI-VI' of FIG. 12 according to some embodiments of the present disclosure.

Display panels shown in FIGS. 12 to 14 may have substantially the same structure as those described with reference to FIGS. 1 to 11 except that a conductive pattern 220a (refer to FIG. 7) covering organic patterns OL1 and OL2 is not provided.

Referring to FIGS. 12 to 14, since the conductive pattern 220a covering the organic pattern OL1 and OL2 in the plane is not provided, an occurrence of a short circuit between a plurality of signal lines SL, which is caused by the conductive pattern 220a, may be prevented. In addition, a short circuit between the signal lines SL and a power line PP, which is caused by the conductive pattern 220a, may be prevented from occurring.

A first pattern OL1 and a second pattern OL2 may be stacked in a first-first portion area OA1-1, and the second pattern OL2 may be disposed in a first-second portion area OA1-2. The organic patterns OL1 and OL2 may not be disposed in a second portion area OA2. Since the second portion area OA2 may surround the first-first portion area OA1-1, the transmission of substances that cause corrosion to the signal line SL may be prevented by the organic patterns OL1 and OL2.

Although aspects of some embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of embodiments according to the present disclosure shall be determined according to the attached claims, and their equivalents.

What is claimed is:

1. A display device comprising:
- a base layer comprising:
  - a first area comprising a display area and a non-display area; and
  - a second area adjacent to the first area and bent at a predetermined curvature;
- a plurality of lower inorganic layers disposed on the base layer;
- a pixel disposed in the display area;
- a signal line electrically connected to the pixel and comprising a first line portion extending in a first direction in a plan view and overlapping the non-display area and a second line portion disposed on the first line portion, overlapping the non-display area and the second area, and connected to the first line portion in the non-display area;
- an organic pattern disposed on a lower inorganic layer disposed at an uppermost position among the lower inorganic layers and disposed on an area where the first line portion is connected to the second line portion in the non-display area;
- an upper inorganic layer covering the organic pattern in a plan view;
- a conductive pattern disposed on the upper inorganic layer and covering the organic pattern in the plan view; and
- a power line disposed closer to the display area than the second line portion, extending in a second direction crossing the first direction and crossing the first line portion in the plan view, wherein the conductive pattern is spaced apart from the power line by a distance of at least about 4 micrometers in the plan view.

2. The display device of claim 1, wherein the conductive pattern is spaced apart from the power line by a distance equal to or greater than about 4 micrometers and equal to or smaller than about 7 micrometers in the plan view.

3. The display device of claim 1, wherein the conductive pattern is spaced apart from the organic pattern by a distance equal to or greater than about 1 micrometer and equal to or smaller than about 3 micrometers in the plan view.

4. The display device of claim 1, wherein the organic pattern comprises:
- a first pattern; and
- a second pattern disposed on the first pattern and disposed inside the first pattern in the plan view.

5. The display device of claim 4, further comprising a protective conductive pattern overlapping the first area and covering a portion of the second line portion in the plan view.

6. The display device of claim 5, wherein a portion of the protective conductive pattern is disposed between the first pattern and the second pattern.

7. The display device of claim 5, wherein the protective conductive pattern extends in a direction substantially parallel to a direction in which the second line portion extends.

8. The display device of claim 5, wherein the second line portion is divided into a plurality of lines, the protective conductive pattern is divided into a plurality of line protective patterns, and the line protective patterns overlap the plurality of lines, respectively.

9. The display device of claim 8, wherein an end of the conductive pattern is disposed further away from the second area than a point where the second line portion is divided.

10. The display device of claim 1, wherein the lower inorganic layer disposed at the uppermost position among the lower inorganic layers comprises a first portion area in which the organic pattern is disposed and a second portion area in which the organic pattern is not disposed, and the second portion area surrounds the organic pattern.

11. The display device of claim 10, wherein the conductive pattern overlaps the first portion area and a portion of the second portion area.

12. The display device of claim 10, wherein the upper inorganic layer covers the first portion area and the second portion area.

13. The display device of claim 1, wherein the first line portion and the second line portion are connected to each other via a contact hole defined through some of the lower inorganic layers.

14. The display device of claim 1, wherein the conductive pattern is provided in plural, and the conductive patterns adjacent to each other are spaced apart from each other by a distance equal to or greater than about 6 micrometers and equal to or smaller than about 10 micrometers in the plan view.

15. The display device of claim 1, wherein the lower inorganic layers corresponding to the second area have a groove defined therein and extending in a direction in which a bending axis extends.

16. A display device comprising:
- a base layer comprising:
  - a first area comprising a display area and a non-display area; and
  - a second area adjacent to the first area and bent at a predetermined curvature;
- a plurality of lower inorganic layers disposed on the base layer;
- first and second pixels disposed in the display area;
- a first signal line electrically connected to the first pixel and comprising:
  - a first-first line portion overlapping the non-display area; and
  - a second-first line portion disposed on the first-first line portion, overlapping the non-display area and the second area, and connected to the first-first line portion in the non-display area;
- a second signal line electrically connected to the second pixel and comprising:
  - a first-second line portion overlapping the non-display area; and
  - a second-second line portion disposed on the first-second line portion, overlapping the non-display area and the second area, and connected to the first-second line portion in the non-display area;
- a first organic pattern disposed on a lower inorganic layer disposed at an uppermost position among the lower inorganic layers and disposed on an area where the first-first line portion is connected to the second-first line portion in the non-display area;
- a second organic pattern disposed on the lower inorganic layer disposed at the uppermost position among the lower inorganic layers and disposed on an area where the first-second line portion is connected to the second-second line portion in the non-display area;

an upper inorganic layer covering the first and second organic patterns in a plan view;

a first conductive pattern disposed on the upper inorganic layer and covering the first organic pattern in the plan view; and a second conductive pattern disposed on the upper inorganic layer and covering the second organic pattern in the plan view, wherein the first conductive pattern is spaced apart from the second conductive pattern in the plan view by a distance equal to or greater than about 6 micrometers and equal to or smaller than about 10 micrometers in the plan view.

17. The display device of claim 16, wherein the first conductive pattern is spaced apart from the first organic pattern by a distance equal to or greater than about 1 micrometer and equal to or smaller than about 3 micrometers in the plan view, and the second conductive pattern is spaced apart from the second organic pattern by a distance equal to or greater than about 1 micrometer and equal to or smaller than about 3 micrometers in the plan view.

18. The display device of claim 16, further comprising:

a first protective conductive pattern overlapping the first area and covering a portion of the second-first line portion in the plan view; and a second protective conductive pattern overlapping the second area and covering a portion of the second-second line portion in the plan view.

19. The display device of claim 16, wherein an organic pattern is not disposed between the first organic pattern and the second organic pattern.

20. An electronic device comprising:

a display device comprising:

a base layer comprising:

a first area comprising a display area and a non-display area; and a second area adjacent to the first area and bent at a predetermined curvature;

a plurality of lower inorganic layers disposed on the base layer;

a pixel disposed in the display area;

a signal line electrically connected to the pixel and comprising a first line portion extending in a first direction in a plan view and overlapping the non-display area and a second line portion disposed on the first line portion, overlapping the non-display area and the second area, and connected to the first line portion in the non-display area;

an organic pattern disposed on a lower inorganic layer disposed at an uppermost position among the lower inorganic layers and disposed on an area where the first line portion is connected to the second line portion in the non-display area;

an upper inorganic layer covering the organic pattern in a plan view; and a power line disposed closer to the display area than the second line portion, extending in a second direction crossing the first direction and crossing the first line portion in the plan view, wherein the lower inorganic layer disposed at the uppermost position among the lower inorganic layers comprises a first portion area in which the organic pattern is disposed and a second portion area in which the organic pattern is not disposed, and the second portion area surrounds the organic pattern.

* * * * *